US008819331B2

(12) United States Patent
Toda

(10) Patent No.: US 8,819,331 B2
(45) Date of Patent: Aug. 26, 2014

(54) MEMORY SYSTEM AND MEMORY CONTROLLER

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 13/367,655

(22) Filed: Feb. 7, 2012

(65) Prior Publication Data

US 2012/0233383 A1 Sep. 13, 2012

(30) Foreign Application Priority Data

Mar. 7, 2011 (JP) ................................ 2011-048533

(51) Int. Cl.
*G06F 12/16* (2006.01)
*G06F 11/10* (2006.01)
*G06F 11/00* (2006.01)

(52) U.S. Cl.
CPC .................. *G06F 11/1072* (2013.01)
USPC ............ 711/103; 714/703; 714/781; 714/823

(58) Field of Classification Search
USPC ................................................. 714/823, 810
See application file for complete search history.

(56) References Cited

U.S. PATENT DOCUMENTS

| 6,360,346 | B1 | 3/2002 | Miyauchi et al. | |
|---|---|---|---|---|
| 7,149,947 | B1 * | 12/2006 | MacLellan et al. | ............ 714/758 |
| 2007/0271494 | A1 * | 11/2007 | Gorobets | ..................... 714/763 |
| 2008/0192539 | A1 * | 8/2008 | Choi et al. | ............... 365/185.03 |
| 2009/0113217 | A1 * | 4/2009 | Dolgunov et al. | ............ 713/190 |
| 2009/0244991 | A1 * | 10/2009 | Iwasa et al. | ............... 365/189.08 |
| 2010/0165730 | A1 | 7/2010 | Sommer et al. | |
| 2010/0211856 | A1 * | 8/2010 | Weingarten | .................... 714/777 |
| 2010/0257327 | A1 * | 10/2010 | Kosugi | .......................... 711/162 |

FOREIGN PATENT DOCUMENTS

| JP | 6-209267 A | 7/1994 |
|---|---|---|
| JP | 11-73797 A | 3/1999 |

OTHER PUBLICATIONS

Japanese Office Action issued Jul. 9, 2013 in Patent Application No. 2011-048533 with English Translation.
U.S. Appl. No. 13/232,456, filed Sep. 14, 2011, Haruki Toda.

* cited by examiner

*Primary Examiner* — Christian P Chace
*Assistant Examiner* — Leandro Villanueva
(74) *Attorney, Agent, or Firm* — Oblon, Spivak, McClelland, Maier & Neustadt, L.L.P.

(57) ABSTRACT

A memory system according to the embodiment comprises a memory device including a plurality of memory cells operative to store storage data, the storage containing input data from external to which parity information is added; and a memory controller operative to convert between the input data and the storage data, the storage data containing information data corresponding to the input data, and a relationship between the information data and the input data being nonlinearly.

21 Claims, 23 Drawing Sheets

FIG. 2

|  | MLC | page<3> | page<2> | page<1> | page<0> |
|---|---|---|---|---|---|
|  | 15 | 1 | 0 | 0 | 0 |
|  | 14 |  |  | 1 | 1 |
|  | 13 |  |  |  | 1 |
|  | 12 |  |  |  | 0 |
|  | 11 |  | 1 | 1 | 0 |
|  | 10 |  |  |  | 1 |
|  | 9 |  |  | 0 | 1 |
|  | 8 |  |  |  | 0 |
|  | 7 | 0 | 1 | 0 | 0 |
|  | 6 |  |  |  | 1 |
|  | 5 |  |  | 1 | 1 |
|  | 4 |  |  |  | 0 |
|  | 3 |  | 0 | 1 | 0 |
|  | 2 |  |  |  | 1 |
|  | 1 |  |  | 0 | 1 |
|  | 0 |  |  |  | 0 |

US 8,819,331 B2

MEMORY SYSTEM AND MEMORY CONTROLLER

CROSS-REFERENCE TO RELATED APPLICATIONS

This application is based upon and claims the benefit of priority from the prior Japanese Patent Application No. 2011-048533, filed on Mar. 7, 2011, the entire contents of which are incorporated herein by reference.

FIELD

The embodiment relates to a memory system and memory controller.

BACKGROUND

Variable resistance memories (ReRAM: Resistance RAM) and so forth, which can be easily formed in 3 dimensions, have received attention as mass data storable memories. Technologies for storing mass data include not only the use of specific memory cells such as ReRAM but also multi-leveling of memory cells. This technology can be found, for example, in NAND flash memories.

When memory cells are multi-leveled in this way, data errors may occur easily. Therefore, a technology for detecting and correcting errors in data becomes essential. Therefore, up to now, there have been proposed memory controllers that contain various error detection and correction systems.

When memory devices are constructed using these memory controllers, the ability of discriminating the contents of processing in the memory controllers is effective from the viewpoint of the reliability of the entire memory system, the efficiency of data processing, and the extensibility of the memory system.

BRIEF DESCRIPTION OF THE DRAWINGS

FIG. 2 is a diagram showing an example of the correspondence between the level of 1 MLC (Multi-Level Cell) and 1 bit of a page buffer in the memory system according to the embodiment.

DETAILED DESCRIPTION

A memory system according to the embodiment comprises a memory device including a plurality of memory cells operative to store storage data, the storage data containing input data from external to which parity information is added; and a memory controller operative to convert between the input data and the storage data, the storage data containing information data corresponding to the input data, and a relationship between the information data and the input data being nonlinearly.

A memory system and memory controller according to the embodiment will now be described below with reference to the drawings.

[Overview of Memory System]

First, the configuration of the memory system according to the embodiment is described briefly.

Figure 1:
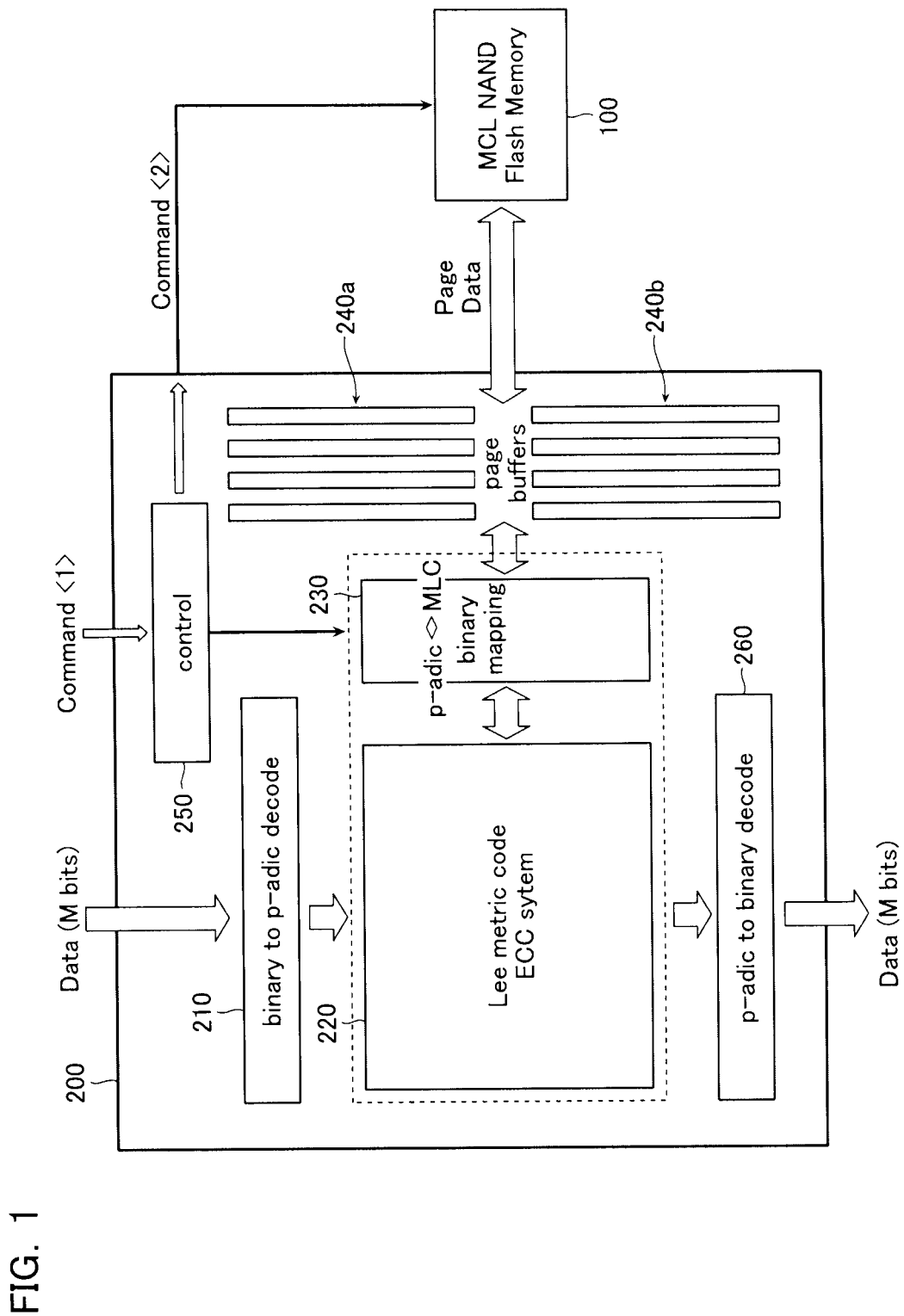
FIG. 1 is a block diagram of a memory system according to the embodiment.

FIG. 1 is a block diagram of the memory system according to the embodiment. This memory system comprises a memory device 100 and a memory controller 200.

The memory device 100 may comprise a NAND flash memory (hereinafter referred to as an "MLC NAND flash memory") using multi-bit storable memory cells (Multi-Level Cell: hereinafter referred to as "MLC"). The following description is mainly given to the embodiment using the MLC NAND flash memory as the memory device 100 though the memory device 100 is not limited to this example. Including the memory controller 200 according to the present embodiment, the memory controller operative to control the MLC NAND flash memory may also be referred to as an "MLC NAND controller".

The memory controller 200 includes a "binary to p-adic decode" circuit block 210, a "Lee metric code ECC system" circuit block 220, a "p-adic <> MLC binary mapping" circuit block 230, 2 page buffer groups 240a and 240b (buffer register), a "control" circuit block 250, and a "p-adic to binary decode" circuit block 260. With respect to the page buffer group, it may be simply referred to as the "page buffer group 240" unless a specific page buffer group is not designated.

A flow of data write in this memory system is as follows.

At the start, binary data input to the MLC NAND controller 200 (memory system) is converted at the "binary to p-adic decode" circuit block 210 to a p-adic number (p is a prime), which is then fed to the "Lee metric code ECC system" circuit block 220.

Subsequently, the p-adic data input to the "Lee metric code ECC system" circuit block 220 is converted at the "Lee metric code ECC system" circuit block 220 to a Lee metric code for ECC processing.

Finally, the Lee metric code is mapped by the "p-adic <> MLC binary mapping" circuit block 230 so that it can be saved in the MLC NAND flash memory 100, and then transferred via the page buffer 240 to and stored in the MLC NAND flash memory 100.

A flow of data read in this memory system is as follows.

At the start, the Lee metric code read out of the MLC NAND flash memory 100 is transferred to the page buffer group 240a or 240b in the MLC NAND controller 200.

Subsequently, the Lee metric code transferred to the page buffer group 240a or 240b is mapped at the "p-adic <> MLC binary mapping" circuit block 230 so that it can be processed in the "Lee metric code ECC system" circuit block 220. Thereafter, the Lee metric code is fed to the "Lee metric code ECC system" circuit block 220.

Subsequently, the Lee metric code fed to the "Lee metric code ECC system" circuit block 220 is subject to ECC processing therein and converted to p-adic data, which is then fed to the "p-adic to binary decode" circuit block 260.

Finally, the p-adic data fed to the "p-adic to binary decode" circuit block 260 is converted to binary data, which is then provided to external from the MLC NAND controller 200 (memory system).

The above series of operations of data write and data read can be controlled by the "control" circuit block 250 that receives a command from an external CPU.

The above is a brief overview of the memory system according to the present embodiment. Hereinafter, the present memory system is described in detail.

First, an MLC NAND flash memory including 16-value MLCs is used as an example to describe the correspondence relation between MLC levels and pages in the MLC NAND flash memory, and then describe ECC, that is, the point of data processing in the MLC NAND controller 200 according to the present embodiment.

The use of 16-value MLCs makes it possible to store 4 bits of binary data per cell. The assignment of 4 bits of binary data to MLC levels can be considered in various patterns though the use of Gray code is considered here. The use of Gray code makes it possible to assign binary data to MLC levels such that a variation between adjacent levels causes only a variation in 1 bit of 4 bits. 4 bits of binary data serve as components of different pages <0>-<3>, respectively.

For example, when numbered 0-15 from the lowermost level to the uppermost level of MLC, bits in the pages <0>-<3> corresponding to MLC levels are determined as shown in FIG. 2. In this case, a bit $p_0$ in the page <0>, a bit $p_1$ in the page <1>, a bit $p_2$ in the page <2>, and a bit $p_3$ in the page <3> can be determined by binary functions $P_0$, $P_1$, $P_2$ and $P_3$ of digits $B_0$, $B_1$, $B_2$ and $B_3$ in the values L of MLC levels expressed in binary numbers as shown in Expression 1.

$$L = B_0 2^0 + B_1 2^1 + B_2 2^2 + B_3 2^3$$

$$p_0 = P_0(B_0, B_1, B_2, B_3)$$

$$p_1 = P_1(B_0, B_1, B_2, B_3)$$

$$p_2 = P_2(B_0, B_1, B_2, B_3)$$

$$p_3 = P_3(B_0, B_1, B_2, B_3) \quad \text{[Expression 1]}$$

In particular, the use of Gray code leads to such coding that a variation of 1 in L varies only one of p0, p1, p2 and p3. In general, any variation in L can be expressed by variations in bits p0-p3 in each page. Therefore, if 1 bit error detection and correction is possible in each of 4 pages <0>-<3>, it is possible to process every error on level variations caused in 1 MLC. Further, if it is assumed that an MLC level variation occurs only between adjacent levels, 1-bit correction to anyone page makes it possible to execute error detection and correction. Therefore, if 1-bit error detection and correction is independently possible at every page, it is possible to support independent 4 MLCs.

From the above, the method of executing 1-bit error detection and correction at every page is a strong method capable of processing any errors caused in MLC.

In consideration of the fact that most of errors caused in MLC arise between adjacent levels, however, the method of error detection and correction as described above excessively supports errors and accordingly handles a larger amount of information to the extent not required usually in error detection and correction. Thus, the method is inefficient.

Next, the efficiency of error detection and correction in the memory system according to the present embodiment is considered and, as the premise, ECC using a binary linear code is described. Here, as examples of the binary linear code, Reed-Solomon code and BCH code are handled.

Reed-Solomon code and BCH code both are code systems in a Galois field $GF(2^m)$. Reed-Solomon code is such that each component of the code is a symbol that can be expressed in m bits, and ECC using Reed-Solomon code targets the symbol error. On the other hand, BCH code is such that each bit is a component of the code, and ECC using BCH code targets the bit error.

Hereinafter, a memory controller containing an ECC system using such the binary linear code may also be referred to as a "binary linear controller". In contrast, a memory controller containing an ECC system using the code system in the Galois field GF(p) (p is a prime) such as the Lee metric code utilized in the present embodiment may also be referred to as a "p-adic controller".

At the start, a method of encoding binary data to Reed-Solomon code is described.

When 1 primitive root of $GF(2^m)$ is denoted with α, a generator polynomial g(X) is configured as a polynomial, of which roots are 2t pieces of $\alpha^{m0+i}$ (m0=0 or 1, i=0 to 2t−1) as shown in Expression 2.

$$g(X) = (X+\alpha^{m0})(X+\alpha^{m0+1})(X+\alpha^{m0+2})\ldots$$
$$(X+\alpha^{m0+2t-1})$$
$$= g_0 + g_1 X + g_2 X_2 + \ldots + g_{2t-1} X^{2t-1} + X^{2t}$$ [Expression 2]

Here, α is an m-bit symbol and a primitive root of GF($2^m$), and a root of an irreducible polynomial $M_1$ (X) in the m-th order GF(2). A coefficient g of g(x) is an m-bit symbol. In addition, t is the maximum number of error-correctable symbols. Subtraction of 2t from n=$2^m$−1, that is, the total number of elements in GF($2^m$) except the zero element yields the number k, which indicates arbitrarily settable symbols of data.

The symbols of data have a length of mk bits when considered in binary, and the (k−1)-th order polynomial u (X) expressive of the data is as in Expression 3.

$$u(X)=u_0+u_1 X+u_2 X^2+\ldots+u_{k-1} X^{k-1}, n=2^m-1, k=n-2t$$ [Expression 3]

When the (2t−1)-th order remainder polynomial v(X) is derived from these polynomials g(X), u(X) as shown in Expression 4, the coefficient symbols v become parity symbols of the code.

$$v(X)=X^{2t}u(X)(\bmod\,g(X))=v_0 v_1 X+v_2 X^2+\ldots+V_{2t-1} X^{2t-1}$$ [Expression 4]

As shown in Expression 5, the coefficient symbols u of the polynomial u(X) expressive of data and the coefficient symbols v of the polynomial v(X) expressive of parity, n symbols in total, can configure a polynomial t(X) expressive of Reed-Solomon code. In a word, Reed-Solomon code directly reflects the symbols of data.

$$t(X)=X^{2t}u(X)+v(X)$$ [Expression 5]

Besides the above, there are some variations in the method of generating symbols of parity from the symbols of data to configure Reed-Solomon code, in which the parts corresponding to data contained in Reed-Solomon code are linearly related to the symbols of data. Therefore, when the symbols of data are expressed in binary, the sum of the symbols can be expressed as the sum of the parts corresponding to data contained in Reed-Solomon code, anyway.

Subsequently, a method of encoding binary data to BCH code is described.

When 1 primitive root of GF($2^m$) is denoted with α, and the m-th order irreducible polynomials having roots α, $\alpha^3$, ..., $\alpha^{2t-1}$ are denoted with $M_1$ (X), $M_3$(X), ..., $M_{2t-1}$ (X), a generator polynomial g(X) can be configured as the product of t-pieces of the m-th order irreducible polynomials, that is, a polynomial shown in Expression 6.

$$g(X)=M_1(X)M_3(X)\ldots M_{2t-1}=1+g_1 X+g_2 X^2+\ldots+g_{mt-1} X^{mt-1}+X^{mt}$$ [Expression 6]

Here, a coefficient M of g (X) is 0 or 1, which can be expressed in 1 bit. In addition, t is the number of error-correctable bits. Subtraction of mt from n=$2^m$−1, that is, the total number of elements in GF($2^m$) except the zero element yields the number k, which indicates arbitrarily settable bits of data.

The bits of data have a length of k bits, and the (k−1)-th order polynomial u(X) expressive of the bits of data is as in Expression 7.

$$u(X)=u_0+u_1 X+u_2 X^2+\ldots+u_{k-1} X^{k-1}, k=n-mt$$ [Expression 7]

When the (mt−1)-th order remainder polynomial v(X) is derived from these polynomials g(X), u(X) as shown in Expression 8, the coefficients become parity bits of BCH code.

$$v(X)=X^{mt}u(X)(\bmod\,g(X))=v_0+v_1 X+\ldots+v_{mt-1} X^{mt-1}$$ [Expression 8]

As shown in Expression 9, the coefficient bits u of the polynomial u(X) expressive of data and the coefficient bits v of the polynomial v (X) expressive of parity, n bits in total, can configure a polynomial t(X) expressive of BCH code. In a word, BCH code directly reflects the bits of data.

$$t(X)=X^{mt}u(X)+v(X)$$ [Expression 9]

Also in the case of BCH code, similar to Reed-Solomon code, the sum of bits of data can be expressed as the sum of parts corresponding to data contained in BCH code.

The following description is given to a method of bit correction with ECC using BCH code. Described here is a method utilizing page buffers contained in the NAND flash memory.

Figure 3:
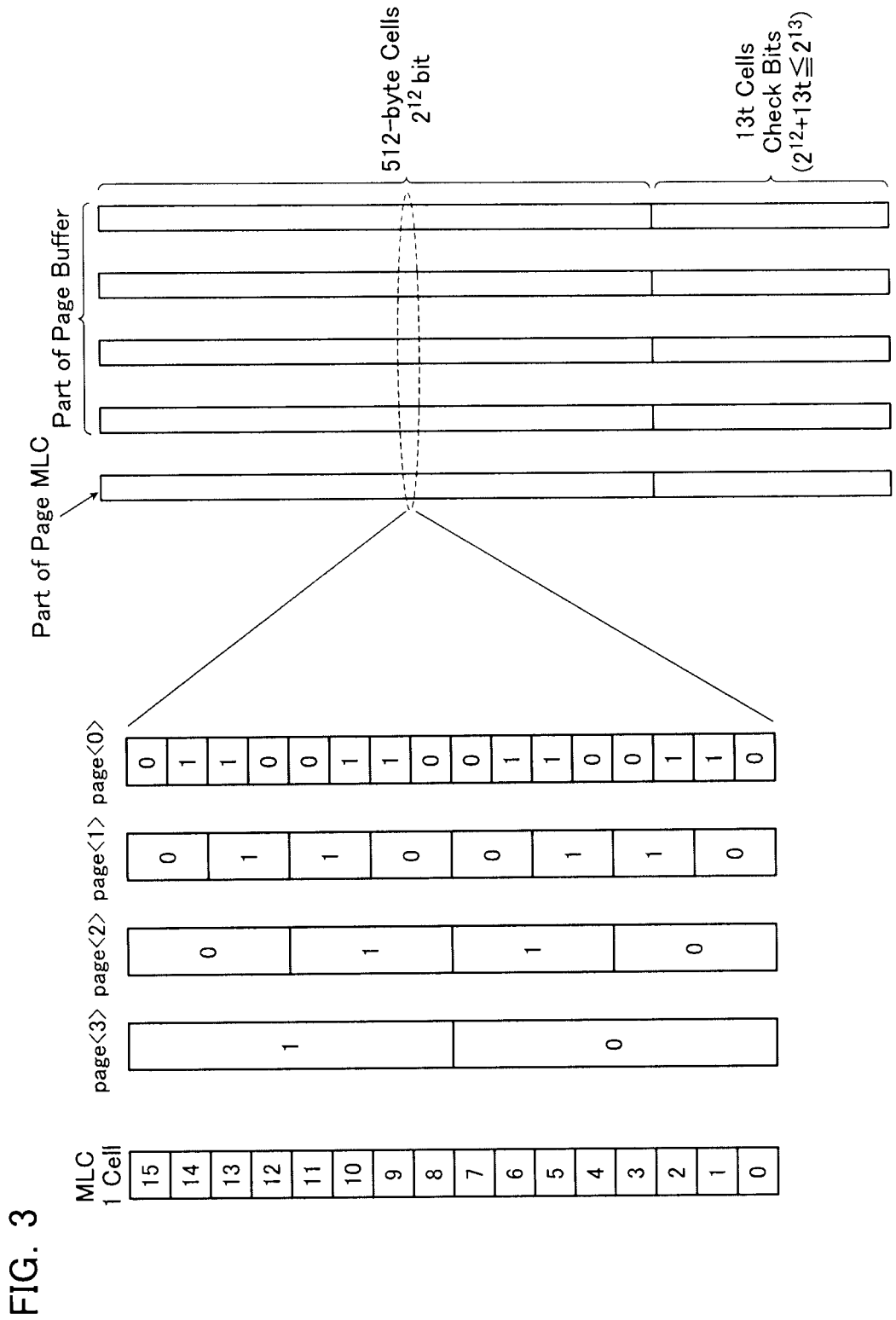
FIG. 3 is a diagram illustrative of an ECC using a binary code (Gray code).

FIG. 3 is a diagram showing a part of MLCs configuring page data and the corresponding part of a page buffer. The correspondence between the levels of 1 MLC and the bits in a page is shown in FIG. 2 and also enlarged in FIG. 3. The part of the page buffer shown in FIG. 3 corresponds to the so-called sector, which is a part that serves as 1 set for data processing. In the case of FIG. 3, 1 page includes 512-byte MLCs.

The MLC NAND flash memory in this example corresponds to 16-value MLCs and therefore provides 512-byte MLCs with 4 series of page buffers. These 4 series of page buffers correspond to 512-byte memory cells in total.

Here, the MLC NAND flash memory thus configured is targeted to study a memory system characteristic of the binary linear controller according to a comparison example.

As 512 bytes include $2^{12}$ bits, ECC processing in the binary linear controller utilizes GF($2^{13}$). This is because the use of GF($2^{12}$) makes it impossible to configure additional parity bits.

When GF($2^{13}$) is used, check bits required for 1-bit error correction include 13 bits. The number of bits per page buffer required for t-bit error correction (t is an integer of 1 or more) is equal to the sum of 512 bytes of data and 13t bytes of check bits. Therefore, if 512 bytes of data can be dealt, the easily expandable number, t, of correctable bits is required to satisfy an inequality, $2^{12}$+13t $2^{13}$. With such the configuration, and on the assumption that only the error between adjacent levels arises in the MLC, the use of Gray code makes it possible to correct 4t of (512 bytes+13t) MLCs. The example shown in FIG. 3 thus configured makes it possible to additionally correct any errors caused in t MLCs.

As described above, however, most of the errors caused in the MLC arise between adjacent levels. When focusing attention on this point, such the configuration as shown in FIG. 3 can be considered an excessive guarantee to errors. Namely, ECC for data in the page buffer is excessive to the way of causing MLC failures in the NAND flash memory, and the parity part is excessively larger to the extent.

Therefore, the present embodiment utilizes ECC using Lee metric code to reduce the above excessive guarantee. In this case, the parity part can be reduced by just supporting around errors between adjacent levels of MLC. If the parity part of the same size is used, the number of correctable cells can be increased.

The memory controller 200 according to the present embodiment executes ECC processing using Lee metric code. On the other hand, for the purpose of supporting the conventional MLC NAND flash memory, the memory controller 200 converts symbols of Lee metric code into numerals corresponding to MLC levels. This conversion is executed at the "p-adic < > MLC binary mapping" circuit block 230.

The following description is given to the function of the "p-adic < > MLC binary mapping" circuit block 230. An example of the use of 16-level MLCs is described here.

The "p-adic < > MLC binary mapping" circuit block 230 specifically executes mapping of addresses between the page buffers in the MLC NAND flash memory 100 and the page buffer group 240 in the p-adic controller 200.

Mapping starts by deciding the correspondence between 16 MLC levels and a finite field Zp modulo p=13. Here, 2 cases are described on the correspondence relation between the MLC levels and the finite field Zp.

Figure 4:
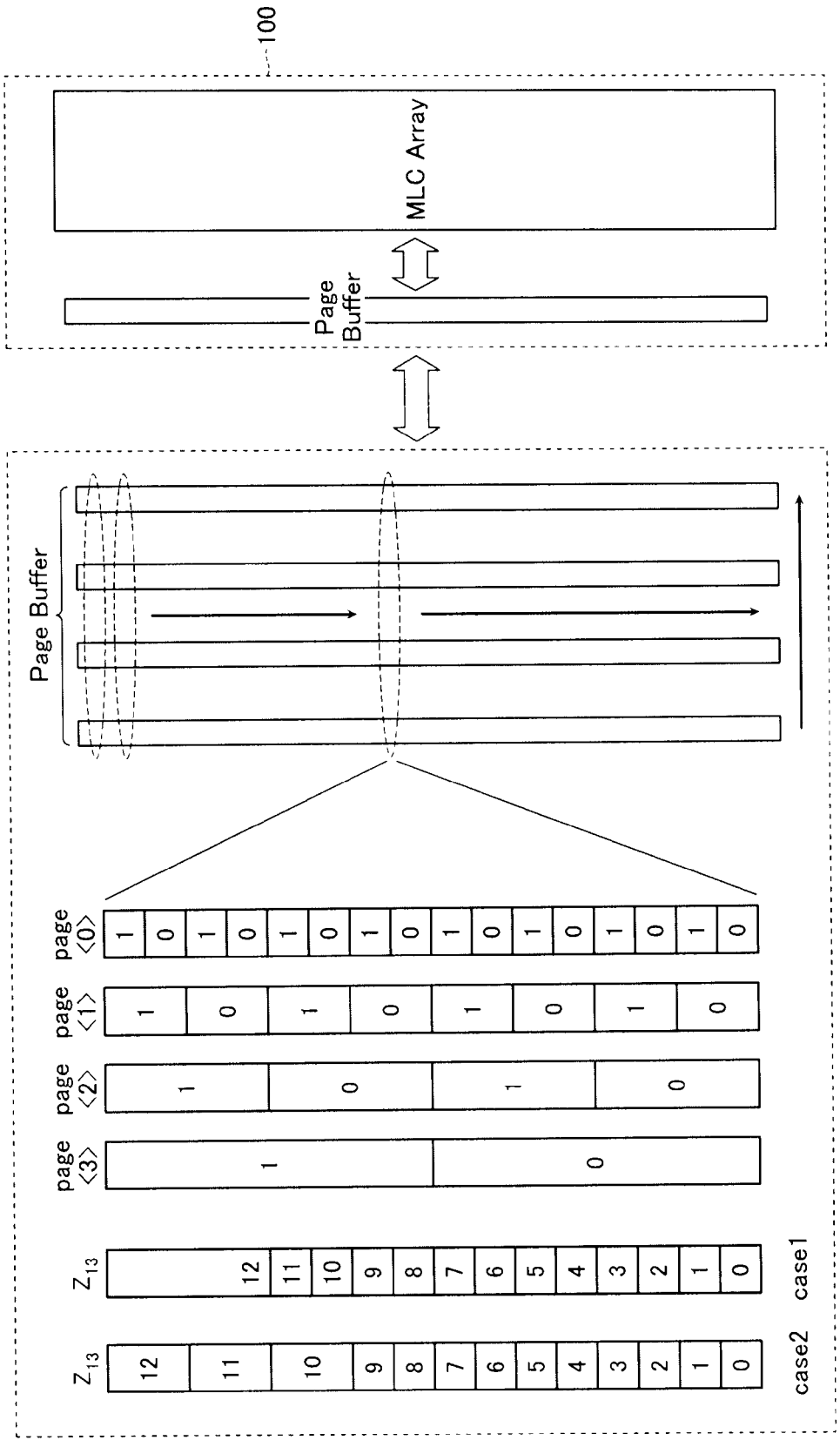
FIG. 4 is a diagram showing an example of the correspondence between numerals in a finite field Zp and MLC levels in the memory system according to the embodiment.

FIG. 4 is a diagram illustrative of the correspondence relation between the MLC levels and Zp.

The case 1 relates to a method of assigning the elements in Zp to the MLC levels in turn from the lower level. In this case, the elements 0-12 in Zp are assigned to the MLC levels in turn from the lower level and the element 12 in Zp is assigned to the remaining upper 3 MLC levels. The case 1 is effective to suppress the amplitude of the voltage pulse applied to the word line in programming the NAND flash memory, thereby reducing the capacitive coupling between the word line and memory cells adjacent to the word line to suppress the disturbance. In a word, the case 1 provides an assigning method expectable to reduce occurrences of errors in memory cells as can be said.

The case 2 relates to an assigning method of setting larger level intervals to higher levels of the MLC levels. In this case, the elements 0-12 in Zp are assigned to the MLC levels in turn from the lower level while the elements 10-12 in Zp of those are assigned at 2-level intervals. The case 2 provides an assigning method capable of executing rough programming to higher levels having larger threshold variations from the erasure level, and expectable to reduce the burden on programming as can be said.

Thus, standing on the characteristics of the 16-level MLC NAND flash memory, it is preferred to determine the above-described assigning method in the case 1 or the case 2 by limiting the purpose, for example, to that for suppressing error occurrences or reducing the programming time. It is also desirable for the memory controller 100 to set any assigning method at any time in accordance with the situation of the memory device 100. In the cases 1 and 2 the elements in Zp are assigned to the MLC levels in turn from the lower level while the elements in Zp can be assigned to the MLC levels in turn from the upper level as well.

Subsequently, the correspondence between the MLC levels and the bits in a page is described with reference to FIG. 4. FIG. 4 shows an example of the use of Gray code in determining the correspondence between the bits in each page and the MLC levels. The bits in a page may vary from product to product though, in such the case, they may be preferably determined in accordance with the memory device 100 in use. Therefore, the correspondence between the page buffer 240 and MLC levels is important information for arranging data in MLC levels in proper order. If mapping in the memory controller 200 can be set flexibly on the basis of this information, it is made possible to realize a memory controller 200 capable of supporting various memory devices. For example, the memory controller 200 may comprise plural types of "p-adic < > MLC binary mapping" circuit blocks 230 or a type-changeable "p-adic < > MLC binary mapping" circuit block 230, which can be switched based on the specification of the memory device 100.

Once the correspondence between the elements in Zp and the MLC levels is determined in this way, the elements in Zp are decoded based on 4 bits in the pages <0>-<3> corresponding to the MLC levels and then held in the page buffer group 240. Therefore, the page buffer group 240 comprises 4 series of page buffers arranged in parallel such that the 4 bits of data decoded through the above-described mapping can be held in respective series in the page buffer group 240 in turn.

One series in the page buffer group 240 in the memory controller 200 corresponds to the page buffer contained in the memory device 100. When the page buffer group 240 in the memory controller 200 is completely filled with data, the data is transferred series by series in turn to the page buffer in the memory device 100. The data in the page buffer group 240 is programmed continuously in the same MLC at the memory device 100. Through such the data write procedure, the elements in Zp obtained at the memory controller 200 can be stored as the MLC levels in the memory device 100.

Reading data from the memory device 100 is executed through the opposite procedure to the above-described data write procedure. In a word, after 4 pages of data in the same MLC are read out in turn, the data is transferred to the page buffer group 240 in the memory controller 200. The data transferred to the page buffer group 240 is decoded to obtain the numerals in Zp indicative of the MLC levels.

Next, mention is made of applications of the memory system according to the present embodiment to general electronic instruments.

General electronic instruments comprise a CPU, and a peripheral device and a memory system around the CPU, which are coupled through command/data buses. In particular, recent electronic instruments utilize a memory device of semiconductor accessible faster than a hard disc, as a large-capacity memory device, in some examples, many of which utilize NAND flash memories.

Figure 5:
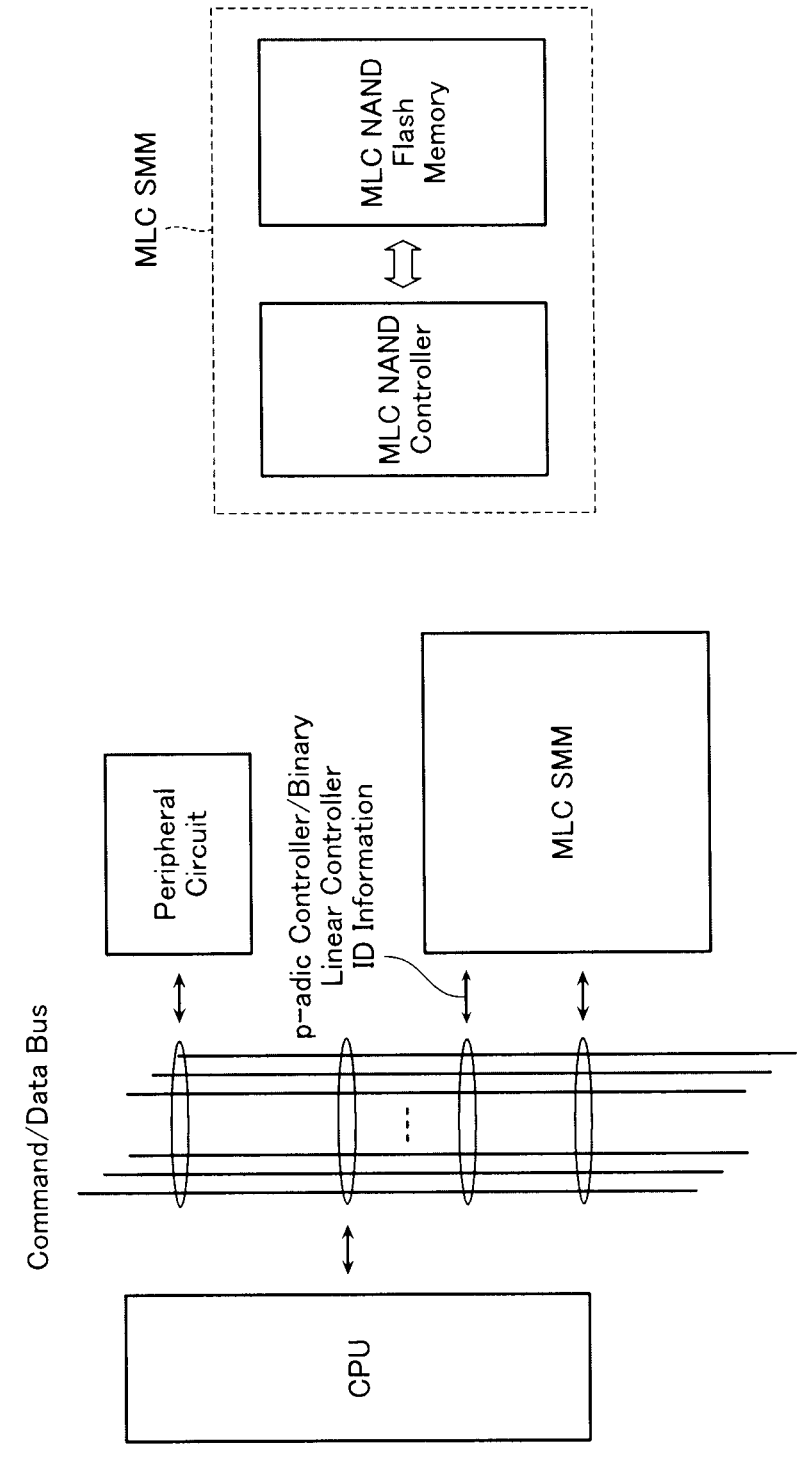
FIG. 5 is a diagram showing an example of the configuration of an instrument applied with the memory system according to the embodiment.

FIG. 5 shows an example of the application of the memory system according to the present embodiment, assuming such the electronic instruments.

The memory system shown with a dashed-line frame in FIG. 5 comprises an MLC NAND flash memory (memory device) and an MLC NAND controller (memory controller). This memory system is represented as an "MLC SMM (Semiconductor Memory Module)" in FIG. 5.

The memory system such as the MLC SMM is a module interchangeable to electronic instruments. In a word, for the purpose of sufficiently exploiting the performance of MLC SMM, it is required to set the command bus and data bus and so forth appropriately in accordance with MLC SMM. Therefore, it is desired to know the contents of processing in MLC SMM. For example, if the type of MLC SMM can be discriminated from the command/data buses, it is made possible to execute data communications in data transfer cycles optimal for the MLC SMM.

If it is not possible to discriminate whether the MLC NAND controller in the MLC SMM is a p-adic controller as in the present embodiment or a binary linear controller as in the comparison example, however, the performance of the p-adic controller cannot be exploited sufficiently.

From such the point, it is important to discriminate the type of the MLC NAND controller contained in the MLC SMM.

Figure 6:
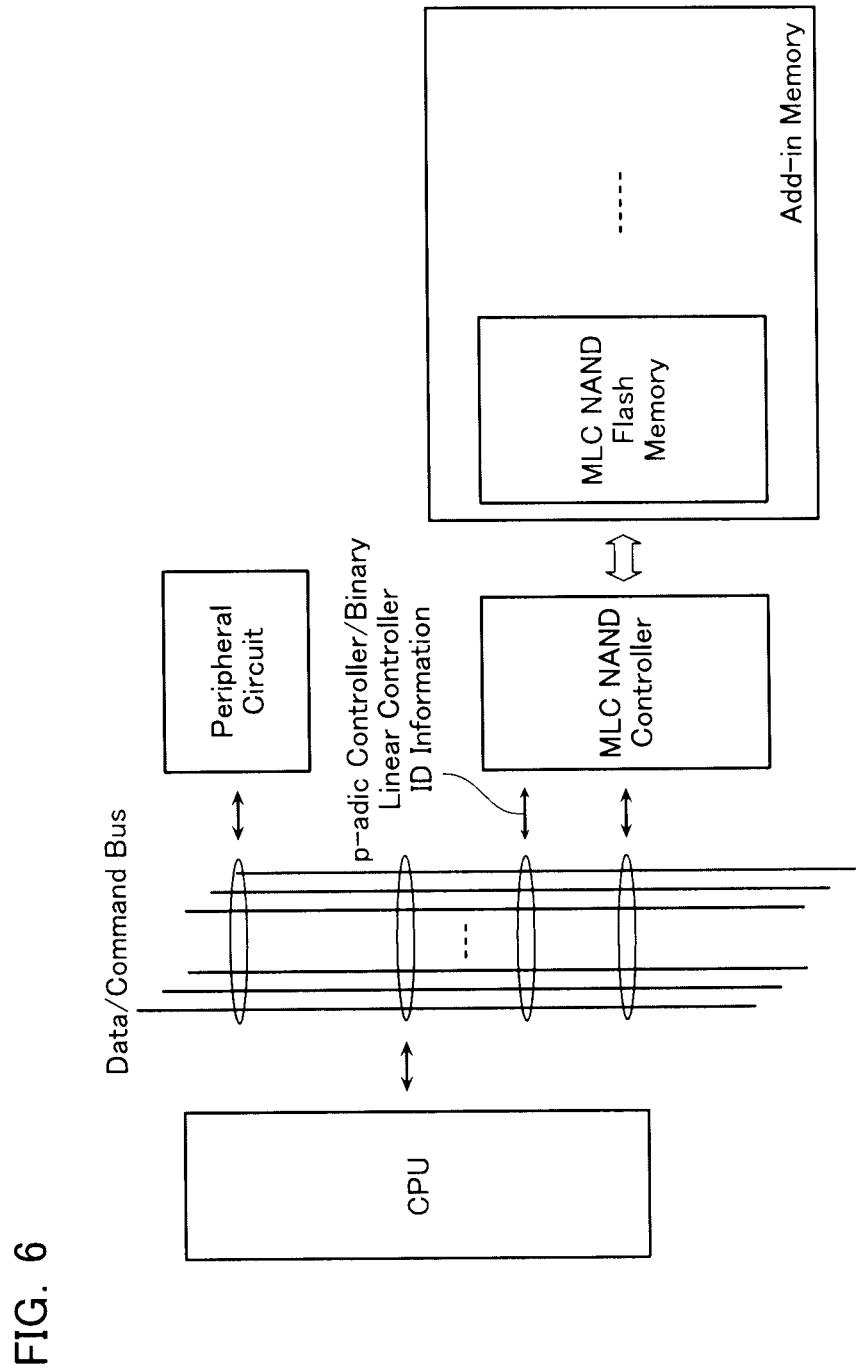
FIG. 6 is a diagram showing an example of the configuration of an instrument applied with a memory controller according to the embodiment.

In addition to the electronic instrument comprising the peripheral device and the memory system (MLC SMM) around the CPU as shown in FIG. 5, only a part of the memory system, that is, the MLC NAND controller (memory controller) is contained in the electronic instrument as shown in FIG. 6 so that MLC NAND flash memories (memory devices) can freely add in.

In this case, if the MLC NAND controller in the electronic instrument contains such an ECC system that improves the reliability of the MLC NAND flash memory, it is possible to construct a highly reliable electronic instrument without turning the MLC NAND flash memory itself to a high-quality one.

If it is possible to decide the type of the memory controller used in the memory controller of the electronic instrument from operation of the electronic instrument itself as in the electronic instruments shown in FIGS. 5 and 6, it is possible to select a memory device at an appropriate cost for ensuring the reliability at the time of adding in a memory device, for example.

Therefore, the following description is given to an overview of processing in the memory controller 200 (p-adic controller) according to the present embodiment, and then to the difference from the binary linear system according the comparison example.

First, FIG. 1 is used to describe the function blocks in detail in the memory system according to the present embodiment.

The memory system according to the present embodiment comprises a memory device 100, and a memory controller 200 operative to control the memory device 100 as described earlier.

The memory device 100 may use the existing memory device such as the MLC NAND flash memory shown in FIG. 1. Even in this case, the use of the memory controller 200 allows ECC using Lee metric code to execute high-efficiency error detection and correction.

Binary data input to the memory controller 200 is converted to the quantity in a finite field $Z_p$ modulo a prime p, which is the data processing system in the memory controller 200. The binary data is processed at every M bits in the memory controller 200.

The binary data input to the memory controller 200 is first fed to the "binary to p-adic decode" circuit block 210. The "binary to p-adic decode" circuit block 210 converts binary data to p-adic data.

The p-adic data is fed to the "Lee metric code ECC system" circuit block 220. The "Lee metric code ECC system" circuit block 220 generates a Lee metric code based on the numerals in $Z_p$ represented by the digits of the p-adic data.

The Lee metric code is fed to the "p-adic < > MLC binary mapping" circuit block 230. The "p-adic < > MLC binary mapping" circuit block 230 maps the numerals in $Z_p$ represented by the symbols of the Lee metric code to the MLC levels for conversion so as to establish the correspondence between the Lee metrics in $Z_p$ and the distances between MLC levels. The "p-adic < > MLC binary mapping" circuit block 230 converts the numerals in $Z_p$ to MLC levels, which are then held in the page buffer group 240*a* or 240*b*.

When 16-level MLCs are used, 1 page buffer group 240 requires 4 series of page buffers. The page buffer group 240 is required to reflect the relation between the MLC levels and the pages in the memory device 100. When the page buffer group 240 is filled with data, the data is transferred from the controller 200 to the memory device 100. This data transfer makes it possible to store the numerals in $Z_p$ as the MLC levels in the memory device 100.

In the case shown in FIG. 1, the memory controller 200 comprises 2 sets of page buffer groups 240A, 240B though it may comprise 1 or more sets of page buffer groups 240. If 2 sets of page buffer groups 240 are provided as shown in FIG. 1, it is possible to transfer data between the page buffer group 240A and the "p-adic < > MLC binary mapping" circuit block 230 and also transfer data between the page buffer group 240*b* and the MLC NAND flash memory at the same time, thereby gaining data transfer time.

The memory device 100 programs the data transferred from the controller 200 in turn at every page. Such the operation of the memory device 100 is executed based on a command <2> supplied from a "control" circuit block 250 in the memory controller 200. The command <2> is generated at the "control" circuit block 250 in accordance with a command <1> fed to the controller 200.

On reading data from the memory system, the command <2> from the "control" circuit block is applied first such that a series of data capable of representing the levels of 1 MLC can be read out of the memory device 100. The series of data are transferred in turn from the memory device 100 to the page buffer group 240 in the memory controller 200 and held therein.

Subsequently, the data held in the page buffer group 240 is processed in the "p-adic < > MLC binary mapping" circuit block 230. The "p-adic < > MLC binary mapping" circuit block 230 converts the data held in the page buffer group 240 to the numeral in $Z_p$, that is, the quantity representative of the MLC level.

Subsequently, the data represented by the numeral in $Z_p$ is fed to the "Lee metric code ECC system" circuit block 220. The "Lee metric code ECC system" circuit block 220 applies error correction to the data to restore the correct Lee metric code and then converts the Lee metric code to p-adic data.

Finally, the p-adic data is fed to a "p-adic to binary decode" circuit block 260. The "p-adic to binary decode" circuit block 260 restores the p-adic data to M bits of binary data and then provides them to the outside of the memory controller 260.

The following description is given to the block configuration seen from the flow of data processing at the data transfer system in the memory controller 200.

Hereinafter, the environment for processing data in binary such as the memory device 100 is referred to as a "binary world". In contrast, the environment for processing data in numerals in $Z_p$ such as the memory controller 200 is referred to as a "p-adic $Z_p$ world". In this case, the "binary world" may also be referred to as a "p-adic $Z_2$ world".

Figure 7:
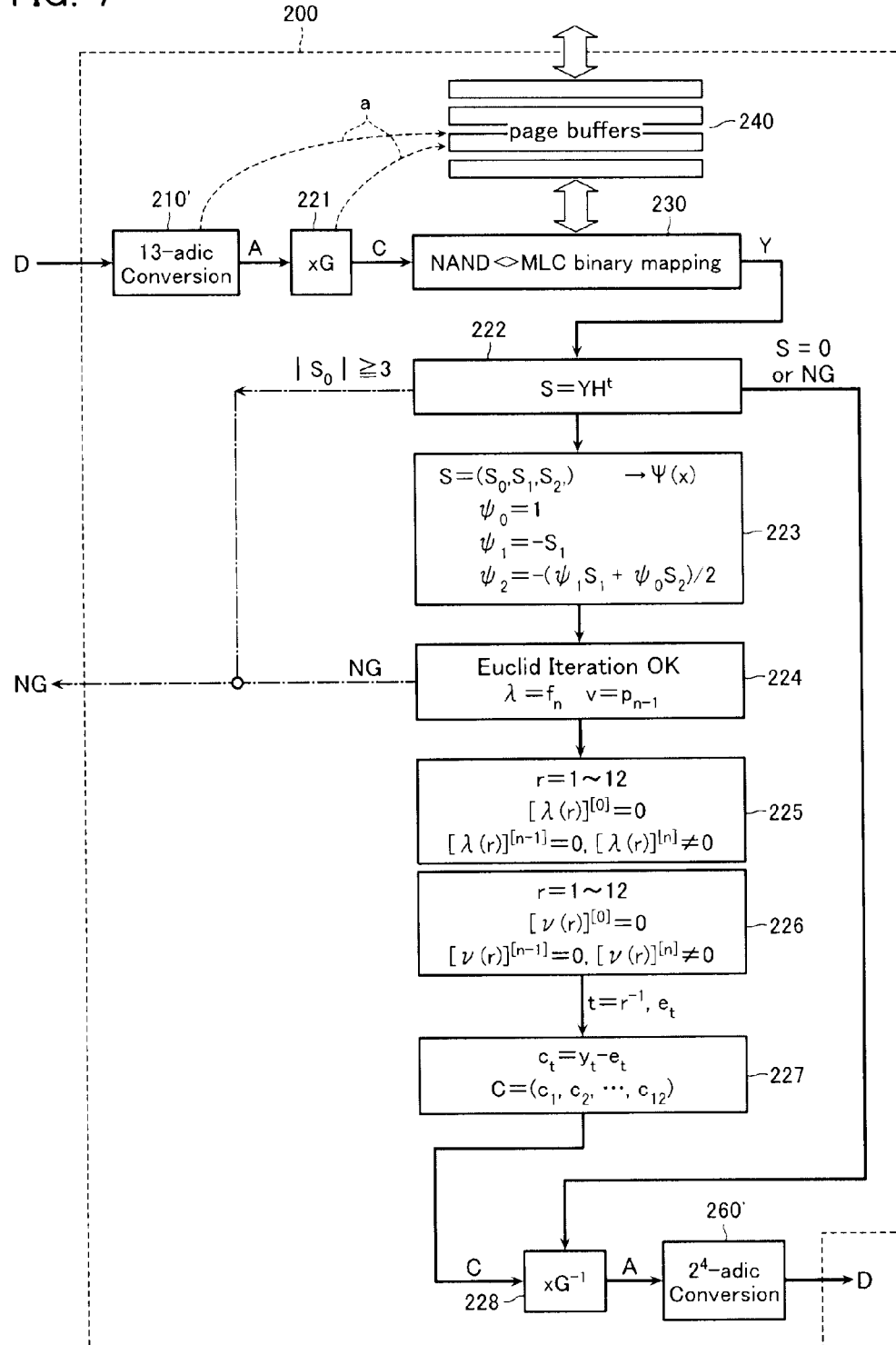
FIG. 7 is a block diagram of a data transfer system in the memory controller according to the embodiment.

FIG. 7 is a block diagram of the memory controller 200 in the case of ε=2, p=13 with a Euclidean iterative method used in ECC processing.

The memory controller 200 comprises a 13-adic converter unit 210', an encoder unit 221, a "p-adic < > MLC binary mapping" circuit block 230, a page buffer group 240, a syndrome generator unit 222, a solution searching polynomial generator unit 223, a Euclidean iteration processing unit 224, a first Hasse differential polynomial generator unit 225, a second Hasse differential polynomial generator unit 226, a code restorer unit 227, a decoder unit 228, and a $2^4$-adic converter unit 260'.

Among those, the 13-adic converter unit 210' is contained in the "binary to p-adic decode" circuit block 210. The encoder unit 221, the syndrome generator unit 222, the solution searching polynomial generator unit 223, the Euclidean iteration processing unit 224, the first Hasse differential polynomial generator unit 225, the second Hasse differential polynomial generator unit 226, the code restorer unit 227 and the decoder unit 228 are contained in the "Lee metric code ECC system" circuit block 220. The $2^4$-adic converter unit 260' is contained in the "p-adic to binary decode" circuit block 260.

Binary data D input, as sets of 32 bits (M=32), to the memory controller 200 is first fed to the 13-adic converter unit 210'.

The 13-adic converter unit 210' converts the input binary data D to a 13-adic number, thereby generating data A having digits represented by the elements in $Z_p$. The data A is sent to the encoder unit 221.

The encoder unit 221 applies a generator matrix G to the input data A, thereby generating a Lee metric code C from the data A. This code C is sent to the "p-adic < > MLC binary mapping" circuit block 230.

The "p-adic < > MLC binary mapping" circuit block 230 uses the input Lee metric code C to generate data to be transferred to the memory device 100, which is then fed to the page buffer group 240.

Thereafter, the data held in the page buffer 240 is transferred to the memory device 100 and programmed in MLCs.

Subsequently, the pieces of data programmed in the memory device 100 are read out as a series of page data to the page buffer group 240. The data is turned at the "p-adic < > MLC binary mapping" circuit block 230 to a code Y that contains an error due to failed MLC-level identification. Subsequent processing includes restoration of an errorless Lee metric code C from the code Y.

The code Y output from the "NAND < > MLC binary mapping" circuit block 230 is provided to the syndrome generator unit 222.

The syndrome generator unit 222 executes operational processing, $S=YH^t$, to the input code Y to generate a syndrome S. If $S_0$ obtained through the operation has a Lee metric of 3 or more ($|S_0|\geq 3$), the sum of individual error code components always becomes equal to 3 or more. In a word, a key to solution with $\epsilon=2$ cannot correct an error in the code Y. Therefore, NG signal is provided to the outside of the memory controller 200, and the code Y before error correction is directly fed to the decoder unit 228. If $S=0$, no error occurs in the code Y, and accordingly the code Y is fed to the decoder unit 228 not through error correction. In the case of other syndromes, the generated syndrome S is sent to the solution searching polynomial generator unit 223.

The solution searching polynomial generator unit 223 uses the input syndrome $S=(S_0, S_1, S_2)$ to generate a polynomial $\Psi(x)$. The polynomial $\Psi(x)$ has coefficients $\psi_0$, $\psi_1$ and $\psi_2$, which are as in Expression 2. The polynomial $\Psi(x)$ is given to the Euclidean iteration processing unit 224.

$$\Psi_0 = 1$$

$$\Psi_1 = -S_1$$

$$\Psi_2 = -(\Psi_1 S_1 + \Psi_0 S_2)/2 \quad \text{[Expression 10]}$$

The Euclidean iteration processing unit 224 uses the input polynomial $\Psi(x)$ and $x^3$ to try the generation of polynomials $\lambda(x)$ and $v(x)$ through the Euclidean iterative method. Unless the polynomials $\lambda(x)$ and $v(x)$ can be generated, NG signal is provided to the outside of the memory controller 200, and the code Y before error correction is directly fed to the decoder unit 228. On the other hand, if the polynomials $\lambda(x)$ and $v(x)$ can be generated, the flow shifts processing to the first Hasse differential polynomial generator unit 225 and the second Hasse differential polynomial generator unit 226.

The first Hasse differential polynomial generator unit 225 generates a Hasse differential polynomial from the polynomial $\lambda(x)$ and substitutes $r=i-12$ into the Hasse differential polynomial to extract a root r that satisfies $[\lambda(r)]^{[0]}=0$. Subsequently, it uses the extracted root r to derive the multiplicity n that satisfies $[\lambda(r)]^{[n-1]}=0$ and $[\lambda(r)]^{[n]}\neq 0$. Then, the position $t=r^{-1}$ and the error $e_t=n$ based on these root r and multiplicity n are provided to the decoder unit 227.

Similarly, the second Hasse differential polynomial generator unit 226 generates a Hasse differential polynomial from the polynomial $v(x)$ and substitutes $r=i-12$ into the Hasse differential polynomial to extract a root r that satisfies $[v(r)]^{[0]}=0$. Subsequently, it uses the extracted root r to derive the multiplicity n that satisfies $[v(r)]^{[n-1]}=0$ and $[v(r)]^{[n]}\neq 0$. Then, the position $t=r^{-1}$ and the error $e_t=13-n$ based on these root r and multiplicity n are provided to the code restorer unit 227.

The code restorer unit 227 uses the input position t and error $e_t$ to restore the error-corrected Lee metric code $C=(c_1, c_2, \ldots, c_3)$ from $c_t=y_t-e_t$. The Lee metric code C is fed to the decoder unit 228.

The decoder unit 228 applies an inverse conversion of the generator matrix G to the input Lee metric code C, thereby generating p-adic data A having digits represented by the elements in Zp. The p-adic data A is fed to the $2^4$-adic converter unit 260'.

The $2^4$-adic converter unit 260' converts the input p-adic data A to binary data, that is, $2^4$-adic binary data D. The binary data D is provided to the outside of the memory controller 200.

The page buffer group 240 is used only in data communications with the memory device 100 in FIG. 1 while the page buffer group 240 can be used in multiple during the process of data processing as shown with the dotted arrows a in FIG. 7. In this case, the circuit scale of the memory controller 200 can be reduced. The method of using the page buffer group 240 in multiple is described later. The multiple use of the page buffer group 240 during the process of data processing is described next. In the case of the present embodiment, 2 sets of page buffer groups 240a, 240b provided in the memory controller 200 are utilized in data transfer and data processing alternately. Described here is the use in data processing.

Figure 8:
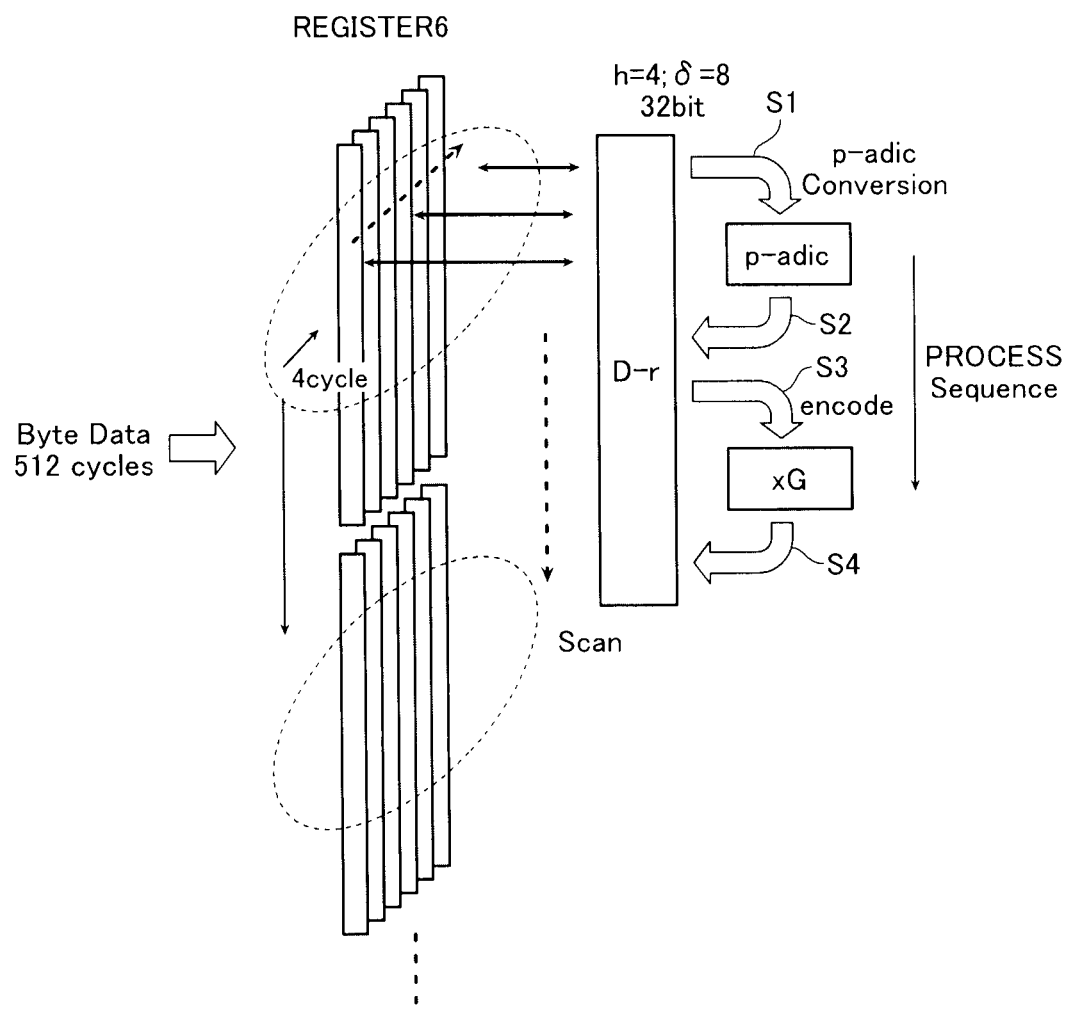
FIG. 8 is a diagram showing an example of the configuration of a register in the case of 2 cells correction/12 cells in the memory controller according to the embodiment.

As a specific example, a memory system using 16-level MLCs and capable of correcting errors in a maximum of 2 cells per 12 cells ($\epsilon=2$) is assumed and described. The memory controller 200 has an I/O data transfer rate of 1 byte (8 bits)/cycle, and 1 sector includes 512 bytes. Therefore, transferring 1 sector data requires 512 cycles as shown in FIG. 8.

In the case of $p=13$, the number of components of the code is equal to $n=p-1=12$. As it is made possible to correct 2 components of those ($\epsilon=2$), data components in the code are equal to $k=n-(\epsilon+1)=12-3=9$. If the number of digits of input binary-represented data is equal to $\delta$ and the number of bits when each digit is binary-represented is equal to $h=4$, then the p-adic conversion turns $\delta$-digit byte data to ($\delta+1$) digits. Therefore, the data components in the code, $k=\delta+1=9$, lead to $\delta=8$. As a result, the number of bits of binary data processed in batch for ECC is equal to $\delta h=8\times 4=32$. Hereinafter, the process of processing required for the process unit, that is, 32 bits of data, is referred to as a "process", which is though represented by "PROCESS" to distinguish it from a general process.

In this case, 32 bits of data in 1 PROCESS can be accumulated at every 4 ($=32/8$) cycles. In a word, processing by 1 PROCESS is made possible at every 4 cycles. In addition, 1-sector data can be processed just in 128 PROCESS without over and short.

The page buffer group 240 conceptually has a basic configuration comprising byte registers, each capable of storing 1 byte in 1 cycle, arrayed in 6 columns. Hereinafter, the basic configuration composed of 6 byte registers may also be referred to as "REGISTER6" as shown in FIG. 8. Hereinafter, byte registers on the 1st column to the n-th column are expressed as "registers <1:n>". For example, byte registers on the 1st column to the 6th column are referred as "registers <1:6>".

The external input binary data D in the case of ϵ=2 is held in the registers <1:4> of REGISTER6. The binary data D held in the registers <1:4> is processed at the following steps S1-S4.

First, at step S1, the binary data D is processed in 128 PROCESS and converted to 13-adic data A. Through this conversion, 32 bits of 1-PROCESS data (δ=8) in the "binary data" are converted to 36 bits of data (δ=9) in the "p-adic Zp world", containing additional 4 bits corresponding to 1 digit. Therefore, the 13-adic data A generated through 128 PROCESS includes 128 PROCESS×36 bits=4608 bits. The 4608 bits of data correspond to the capacity of byte registers on 4.5 columns.

Subsequently, at step S2, the 13-adic data A, having a data quantity corresponding to the byte registers on 4.5 columns, is held in the registers <1:5> of REGISTER6. Therefore, the area in REGISTER6 used to hold the external input binary data D is overwritten with the 13-adic data A.

Subsequently, at step S3, the 13-adic data A is processed in 128 PROCESS and converted to a Lee metric code C. Through this conversion, 36 bits of 1-PROCESS, 13-adic data A are used to generate a 48-bit code in Zp composed of p−1=12 components. Therefore, the Lee metric code C generated through 128 PROCESS includes 128 PROCESS×48 bits=6144 bits (768 bytes). The 768 bytes of data correspond to the capacity of byte registers on 6 columns.

Subsequently, at step S4, the Lee metric code C is held in the registers <1:6>. Therefore, the area in REGISTER6 used to hold the 13-adic data A is overwritten. All the registers <1:6> are used at step S4.

Thus, the binary data D input from the "binary world" in the case of ϵ=2 is held in the registers <1:4> of REGISTER6. The remaining registers <5:6> are overwritten and used until the stage of holding the final data processing result, that is, the Lee metric code C, together with the registers <1:4>.

Data processing at steps S1-S4 includes converting the binary data D to the 13-adic converted data A (steps S1 and S2), then converting the 13-adic data A to the Lee metric code C (steps S3 and S4), and scanning this, as shown in FIG. 8, which can be imagined as a virtual data register D-r.

In the case of data processing shown in FIG. 8, 4096 bits of data in 1 sector are subject to the process of generating 12-cell data at every PROCESS repeatedly over 128 PROCESS. Therefore, the substantial number of bits per cell comes to 4096/(128×12)=2.667.

Thus, the ECC using Lee metric code according to the present embodiment can be referred to as a high-efficiency ECC capable of correcting errors in 2 cells of 12 cells used to store 32 bits of data.

Next, in the case of ϵ=2, the process of processing sector data in REGISTER6 at the time of data writing is described with reference to FIG. 9.

Figure 9:
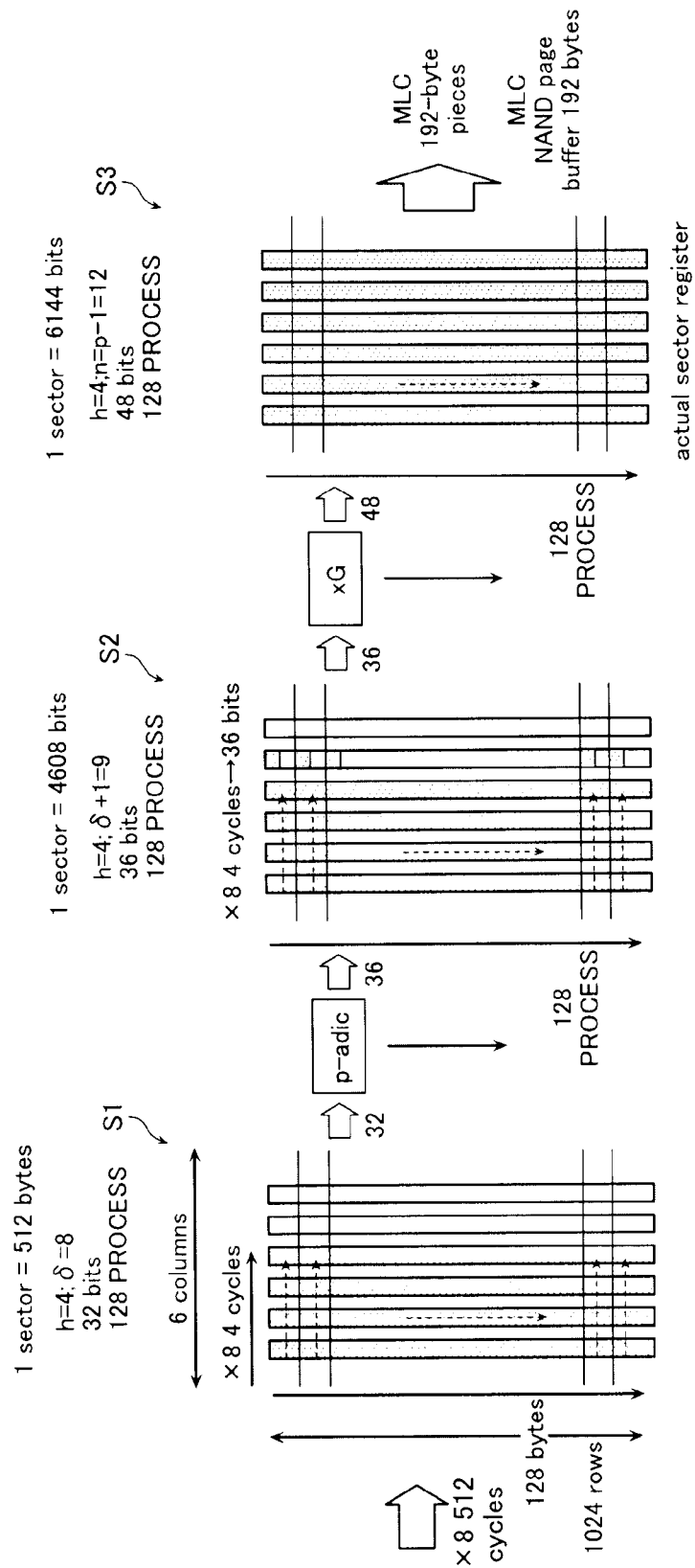
FIG. 9 is a diagram illustrative of data write processing at every sector in the memory controller according to the embodiment.

FIG. 9 shows, sequentially from the left, the state of REGISTER6 at the time of burst transfer of binary data (step S1 in FIG. 9), the state of REGISTER6 after the p-adic conversion (step S2 in FIG. 9), and the state of REGISTER6 after the Lee metric code conversion (step S3 in FIG. 9). The solid line passing through the registers in FIG. 9 indicates the boundary of a byte register at every 8 bits.

The sector register, or REGISTER6, is configured to include 1024 registers aligned in 6 columns and has a receiving portion of 1024 rows for 768-byte data transfer. Of 6 columns, No. 1-4 columns are used in data transfer and the remaining No. 5-6 columns are used in holding the target data after data transfer.

First, at step S1, the transferred binary data is stored at every 4 cycles in the registers on No. 1-4 columns byte by byte in the row direction sequentially. This operation is repeated 128 times. As a result, the registers store 128 bytes of binary data on every column. The total number of cycles in a series of operations is equal to 512 cycles.

Thus, the sector register stores 128-PROCESS, 32-bit binary data corresponding to h=4, δ=8 of a 8-digit, $2^4$-adic number.

Subsequently, at step S2, 32-bit binary data is converted to a 9-digit, p-adic number (P=13), that is, 36-bit data, and overwritten in the sector register. This PROCESS is executed to registers at every 8 rows. The original register block is configured in 1024 rows by 6 columns and is filled at every 8 rows per PROCESS in a total of 128 PROCESS. Until now, the transition from the "binary world" to the "p-adic Zp world" in 1 sector is completed.

Finally, at step S3, the p-adic data is converted to a Lee metric code.

The Lee metric code is data having components that correspond to p−1 (=12) elements in Zp. A Lee metric code by 1 PROCESS is 48-bit data resulted from 36-bit, p-adic data multiplied by a G matrix. The 1-PROCESS Lee metric code is overwritten and stored in one of 8-row, 6-column register blocks. In this case, 1 sector register is entirely filled with the Lee metric code in 128 PROCESS. Thus, the sector register can hold the data to be written in 192-byte pieces of MLCs.

Thus, processing in 3 stages shown at steps S1-S3 sequentially advances at every 8-row, 6-column register block.

In the memory controller 200, the sector register is overwritten with data twice: at the time of conversion from 512-byte binary data to p-adic data; and at the time of conversion from the p-adic data to a Lee metric code, which is written in 192-byte pieces of MLCs.

For example, if the memory device 100, that is, the MLC NAND flash memory has a page configuration of 8 sectors each composed of (512+16) bytes, 4 pages contain data for ((512+16) bytes×8) pieces of MLCs. Accordingly, the levels of 192-byte pieces of MLCs correspond to 22 sector registers herein described. Therefore, the page buffers 240 in the memory controller 200 comprise 22 sector registers, and pieces of data in the page buffers 240 are transferred as 4 pages of data to the MLC NAND flash memory.

If the memory device 100, that is, the MLC NAND flash memory has a page configuration of 4 sectors each composed of (512+16) bytes, 4 pages contain data for ((512+16) bytes×4) pieces of MLCs. Accordingly, the levels of 192-byte pieces of MLCs correspond to 11 sector registers herein described. Therefore, the page buffers 240 in the memory controller 200 comprise 11 sector registers, and pieces of data are transferred as 4 pages of data to the MLC NAND flash memory.

Figure 10:
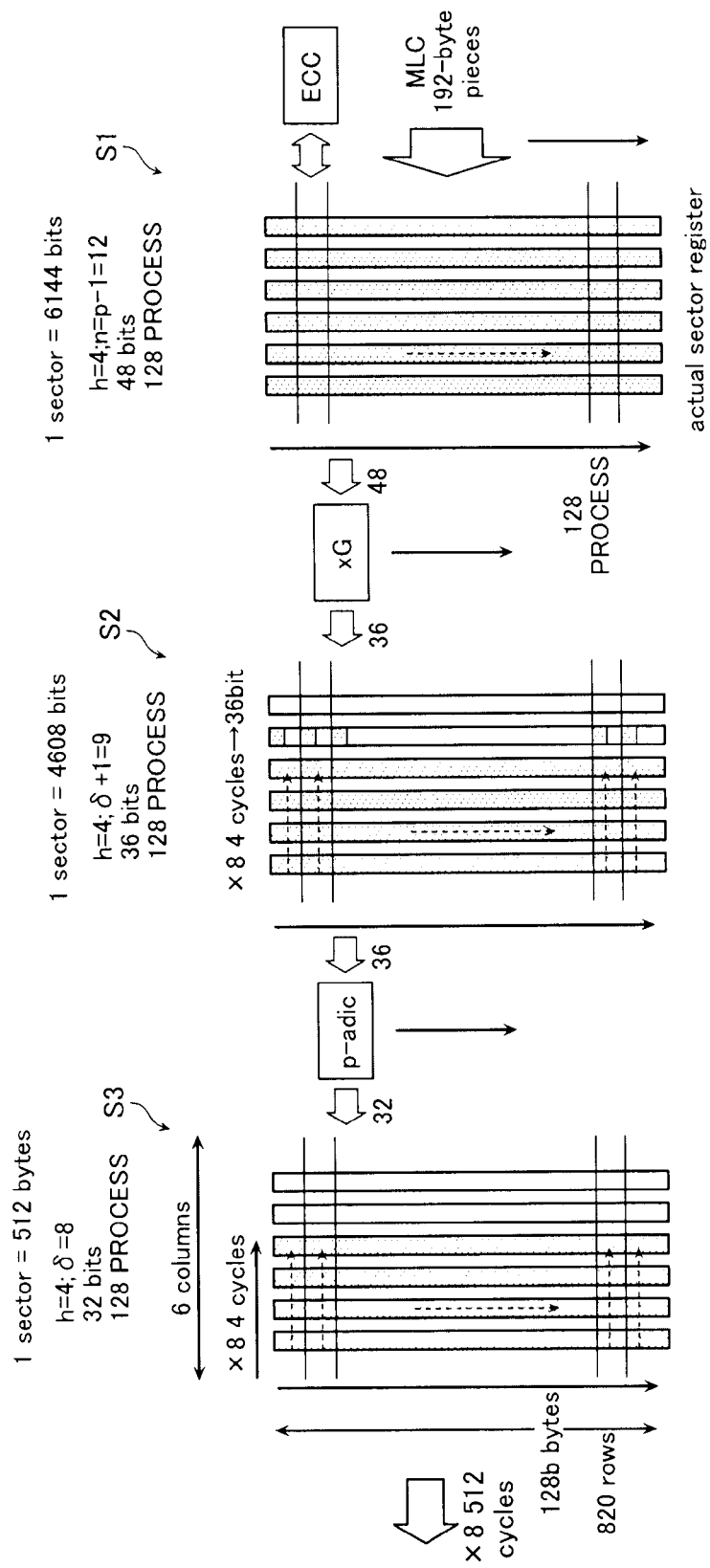
FIG. 10 is a diagram illustrative of data read processing at every sector in the memory controller according to the embodiment.

Next, the process of data processing in the sector register at the time of data read is described with reference to FIG. 10.

First, at step S1, 4 pages of data in the MLC NAND flash memory are transferred collectively at every data stored in 192-byte pieces of MLCs to the page buffers 240 in the memory controller 200.

The 128-PROCESS, 768-byte data stored in the sector register is subject to computation processing by ECC, at every 1-PROCESS data stored in an 8-row, 6-column register block, beginning from the sector register end, then error-corrected if enable, and left as it is if unable. Then, 128 PROCESS can be applied to complete ECC processing over all data in 1 sector to restore the Lee metric code.

Subsequently, at step S2, the Lee metric code restored at step S1 is converted to 13-adic data sequentially. Here, the Lee metric code corresponding to 1 sector is subject to an inverse conversion of the generator matrix G at every 48 bits corresponding to 1 PROCESS such that it is converted to 4-bit, 9-digit-represented 13-adic data and then overwritten in each register block.

Finally, at step S3, the 13-adic data generated at step S2 is converted to $2^4$-adic binary data. The "p-adic to binary decode" circuit block 260 converts the 1-PROCESS, 13-adic data to 4-bit, 8-digit, that is, 32-bit binary data and then overwrites the binary data at every 8-row, 6-column register block.

Thereafter, the binary data is read out at every 8-row, 6-column register group in column order at a rate of 1 byte/cycle and provided as 1-sector data.

Thus, in the memory controller 200, the sector register is overwritten with data twice: at the time of conversion from the Lee metric code to p-adic data executed after ECC processing; and at the time of conversion from the p-adic data to binary data.

Figure 11:
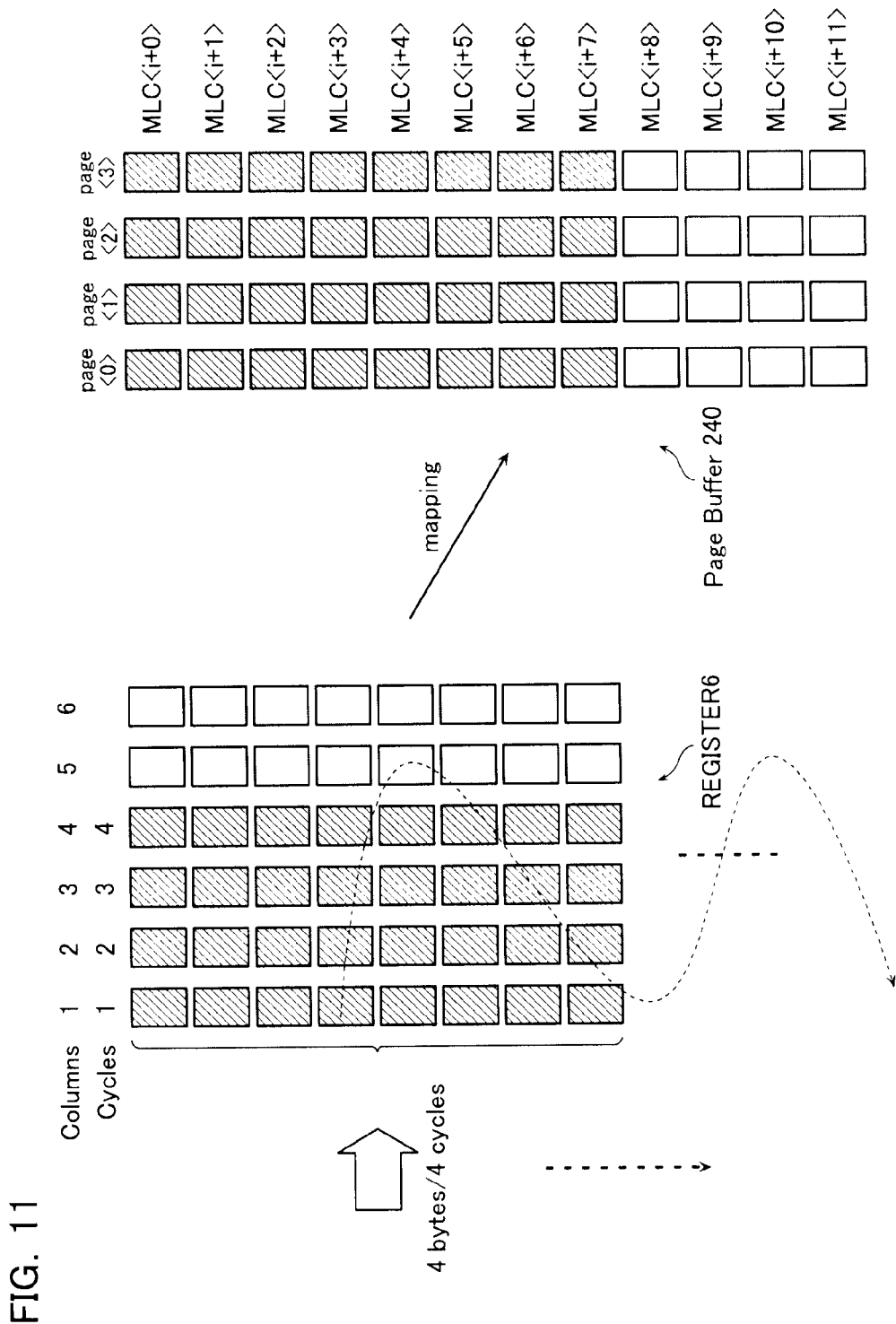
FIG. 11 is a diagram showing an example of the relation between the register and the page buffer in the memory system according to the embodiment.

Next, in the case of c=2, an example is described on the relation between REGISTER6 and the page buffers with reference to FIG. 11. The hatched part in FIG. 11 indicates the area filled with 32 bits of binary data D given in 4 cycles from the "binary world".

REGISTER6 is a group of 8-row, 6-column registers. When this is viewed as the page buffer group 240 in the memory controller 200, it turns to a group of 12-row, 4-column registers as shown in FIG. 11. The columns of the 12-row, 4-column register group correspond to the pages <0>-<4>, respectively.

With regard to a certain i-th PROCESS, the input binary data D is first held in 8 MLCs <i+0> to <i+7> of 12 MLCs <i+0> to <i+11> as shown in FIG. 11, and then the MLCs containing the remaining MLCs <i+8> to <i+11> are overwritten in turn with data during the process of data processing as can be considered imaginarily.

As described above, the memory controller 200 according to the present embodiment uses the page buffer group 240 in multiple during the process of data processing.

The following description is given to the relation between the page buffer in the memory device 100, that is, MLC NAND flash memory and the page buffer group 240 in the memory controller 200. As the premise, an example of operation of the page buffer in the MLC NAND flash memory is described.

Figure 12:
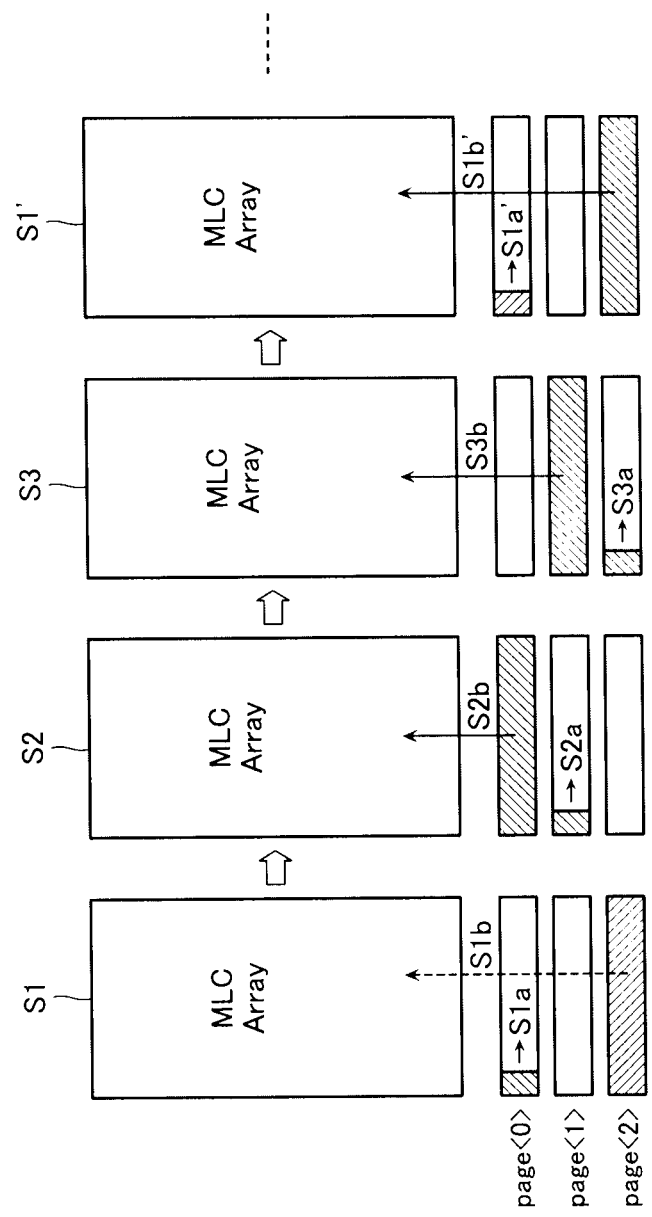
FIG. 12 is a diagram illustrative of operation of the page buffer at the time of data writing in a memory device (8-level MLC NAND flash memory) in the memory system according to the embodiment.

FIG. 12 is a diagram showing an example of operation of the page buffer at the time of data write in the MLC NAND flash memory including 8-level (3-bit) MLCs.

Hereinafter, of 3 bits of MLC, the lowermost weight bit is referred to as "L bit", the around middle weight bit as "M bit", and the uppermost weight bit as "U bit". In addition, pages composed of certain numbers of L bits, M bits and U bits of MLC are referred to as "L page", "M page" and "U page", respectively. Further, L page, M page and U page in common MLCs are collectively referred as a "page group".

The MLC NAND flash memory shown in FIG. 12 comprises 3 series of page buffers, page<0>-<2>. These page buffers, page<0>, <1>, <2>, are used at the time of data write or data read in L page, M page, U page, respectively.

Data write to MLC can be realized by first shifting the threshold level of MLC roughly and then gradually shifting it finely until determined. Therefore, for example, data in L page may be associated with the roughest section of the MLC threshold levels, data in M page with the around middle section of the MLC threshold levels, and data in U page with the finest section of the MLC threshold levels. Then, data write in L page, data write in M page, and data write in U page are executed in turn to determine the MLC threshold level.

Data write in the i-th page group is executed at the following steps.

First, at step S1, data in L page in the i-th page group transferred from the memory controller 200 is stored in the page buffer, page<0> (S1$a$ in FIG. 12). At the same time, data in U page in the (i−1)-th page group already stored in the page buffer, page<2>, is written in an MLC array (S1$b$ in FIG. 12).

Subsequently, at step S2, data in M page in the i-th page group transferred from the memory controller 200 is stored in the page buffer, page<1> (S2$a$ in FIG. 12). At the same time, the data in L page in the i-th page group stored in the page buffer, page<0>, at the previous step S1 is written in the MLC array (S2$b$ in FIG. 12).

Subsequently, at step S3, data in U page in the i-th page group transferred from the memory controller 200 is stored in the page buffer, page<2> (S3$a$ in FIG. 12). At the same time, the data in M page in the i-th page group stored in the page buffer, page<1>, at the previous step S2 is written in the MLC array (S3$b$ in FIG. 12).

Subsequently, at step S1', the data in U page in the i-th page group stored in the page buffer, page<2>, at the previous step S3 is written in the MLC array (S1$b$' in FIG. 12). At the same time, data in L page in the (i+1)-th page group transferred from the memory controller 200 is stored in the page buffer, page<0> (S1$a$' in FIG. 12).

Hereinafter, steps S1-S3 are repeated to complete data write in plural page groups.

Figure 13:
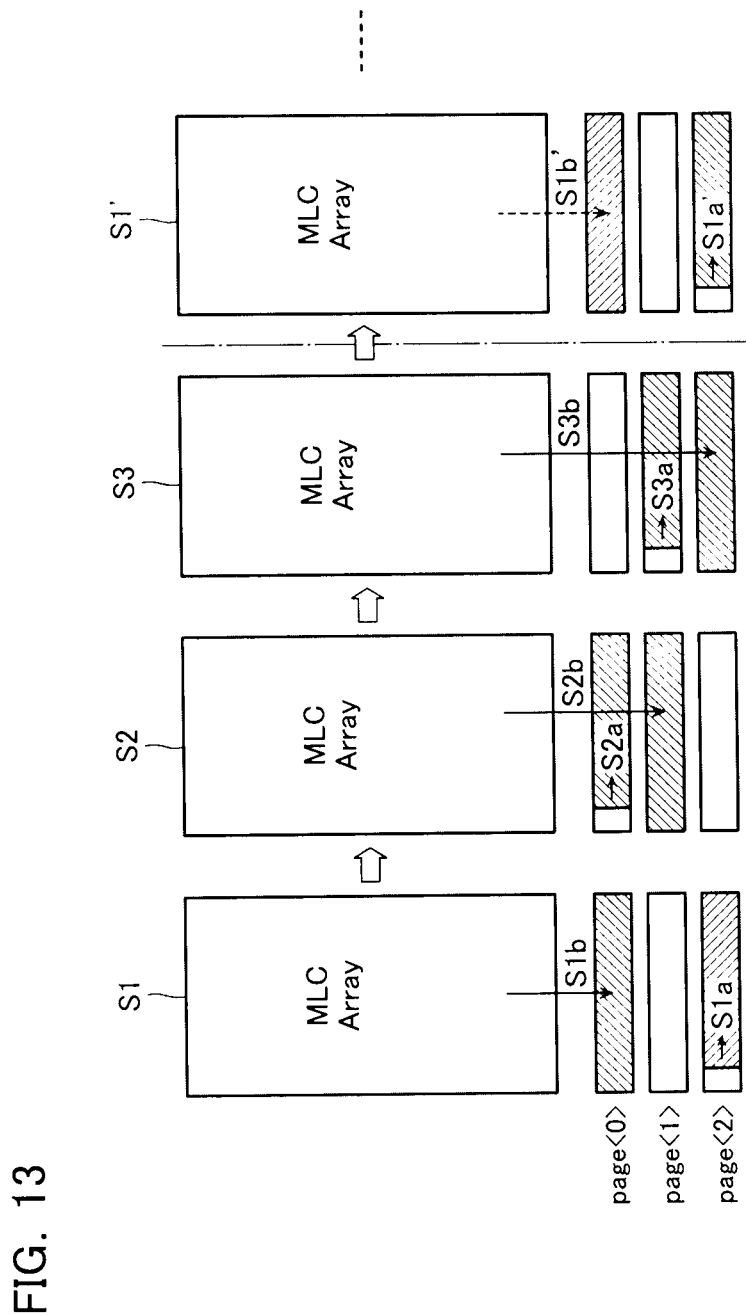
FIG. 13 is a diagram illustrative of operation of the page buffer at the time of data reading in the memory device (8-level MLC NAND flash memory) in the memory system according to the embodiment.

FIG. 13 is a diagram showing an example of operation of the page buffers at the time of data read in the MLC NAND flash memory comprising 8-level (3-bit) MLCs.

Data read in the i-th page group is executed at the following steps.

First, at step S1, data in L page in the i-th page group readout of the MLC array is stored in the page buffer, page<0> (S1$b$ in FIG. 13). At the same time, the data in U page in the (i−1)-th page group already stored in the page buffer, page<2>, is transferred to the memory controller 200 (S1$a$ in FIG. 13).

Subsequently, at step S2, the data in M page in the i-th page group read out of the MLC array is stored in the page buffer, page<1> (S2$b$ in FIG. 13). At the same time, the data in L page in the i-th page group stored in the page buffer, page<0>, at the previous step S1 is transferred to the memory controller 200 (S2$a$ in FIG. 13).

Subsequently, at step S3, the data in U page in the i-th page group read out of the MLC array is stored in the page buffer, page<2>. At the same time, the data in M page in the i-th page group stored in the page buffer, page<2>, at the previous step S3 is transferred to the memory controller 200 (S3$a$ in FIG. 13).

Subsequently, at step S1', the data in U page in the i-th page group stored in the page buffer, page<2>, at the previous step S3 is transferred to the memory controller 200 (S1$a$' in FIG. 13). At the same time, the data in L page in the (i+1)-th page group read out of the MLC array is stored in the page buffer, page<0> (S1$b$' in FIG. 13).

Hereinafter, steps S1-S3 are repeated to complete data read in plural page groups.

As described above, the MLC NAND flash memory progresses storing data in the page buffers, page<0>-<3>, and writing data to the MLC array or reading data from the memory controller 200 at the same time in different pages.

The following description is given to data transfer between the page buffer group 240 in the memory controller 200 and the page buffer in the MLC NAND flash memory in the case of FIGS. 12 and 13.

Figure 14:
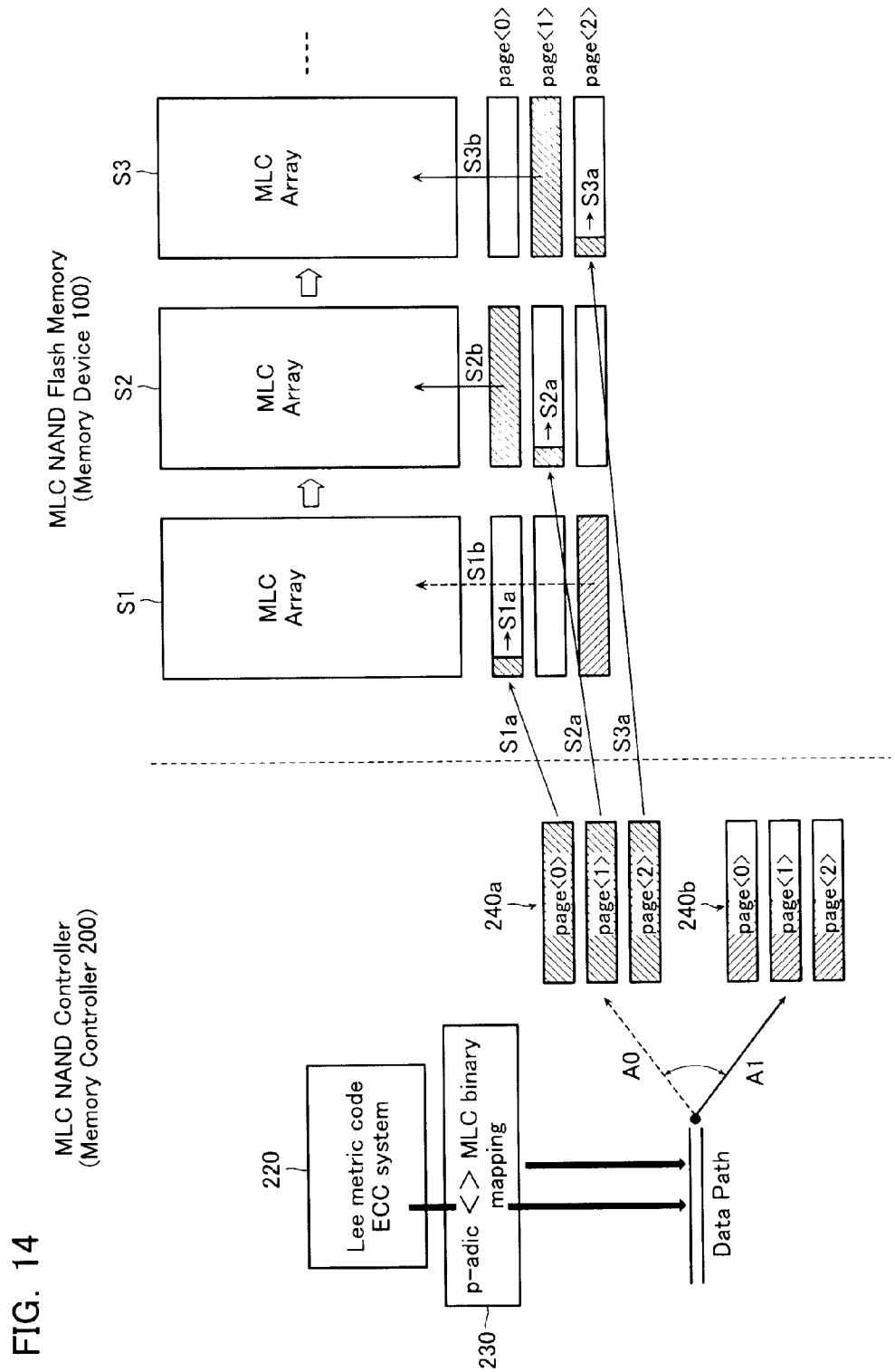
FIG. 14 is a diagram illustrative of data transfer between the memory device (8-level MLC NAND flash memory) and the memory controller at the time of data writing in the memory system according to the embodiment.

FIG. 14 is a diagram illustrative of data transfer between the page buffer group 240a in the memory controller 200 and the page buffer in the MLC NAND flash memory at the time of data write shown in FIG. 12.

FIG. 14 shows the state at the time of writing data to the i-th page group, in which the page buffer group 240a in the memory controller 200 has already stored data to be written in the i-th page group. In addition, the page buffer group 240b keeps the data, which has been written in the (i−1)-th page group. On the other hand, the page buffer, page<2>, in the MLC NAND flash memory has already stored data in U page in the (i−1)-th page group.

The memory controller 200 has a data path operative to selectively connect the "p-adic < > MLC binary mapping" circuit block 230 with the page buffer groups 240a and 240b. In the case of FIG. 14, the data path is connected to the page buffer group 240b (A1 in FIG. 14).

In this state, data transfer at the time of data write to the i-th page group is executed as follows.

First, at step S1, data in L page in the i-th page group transferred from the page buffer, page<0>, in the page buffer group 240a is stored in the page buffer, page<0>, in the MLC NAND flash memory (S1a in FIG. 14). At the same time, the data in U page in the (i−1)-th page group already stored in the page buffer, page<2>, in the MLC NAND flash memory is written in the MLC array (S1b in FIG. 14). In the memory controller 200, data to be written in the (i+1)-th page group is transferred via the "p-adic < > MLC binary mapping" circuit block 230 from the "Lee metric code ECC system" circuit block 220 to the page buffer group 240b. Thus, as shown in FIG. 8, the (i−1)-th data kept in the page buffer group 240b is overwritten with the (i+1)-th data. Data transfer to the page buffer group 240b is also executed in parallel at and after the later-described step S2.

Subsequently, at step S2, after data in L page in the i-th page group is all transferred from the page buffer, page<0>, in the page buffer group 240a to the page buffer, page<0>, in the MLC NAND flash memory, the data in L page in the i-th page group is written in the MLC array (S2b in FIG. 14). At the same time, the data in M page in the i-th page group transferred from the page buffer, page<1>, in the page buffer group 240a is stored in the page buffer, page<1>, in the MLC NAND flash memory (S2a in FIG. 14).

Subsequently, at step S3, after data in M page in the i-th page group is all transferred from the page buffer, page<1>, in the page buffer group 240a to the page buffer, page<1>, in the MLC NAND flash memory, the data in M page in the i-th page group is written in the MLC array (S3b in FIG. 14). At the same time, the data in U page in the i-th page group transferred from the page buffer, page<2>, in the page buffer group 240a is stored in the page buffer, page<2>, in the MLC NAND flash memory (S3a in FIG. 14).

On the other hand, until step S3, the page buffer group 240b in the memory controller 200 has already stored data to be written in the (i+1)-th page group. Thus, immediately after completion of step S3, transfer of data in the (i+1)-th page group to the MLC NAND flash memory is started.

Thereafter, while the connection point of the data path is switched alternately between the page buffer groups 240a (A1 in FIG. 14) and 240b (A2 in FIG. 14), steps S1-S3 are repeated so that transfer of write data for plural page groups can be realized from the memory controller 200 to the MLC NAND flash memory.

Figure 15:
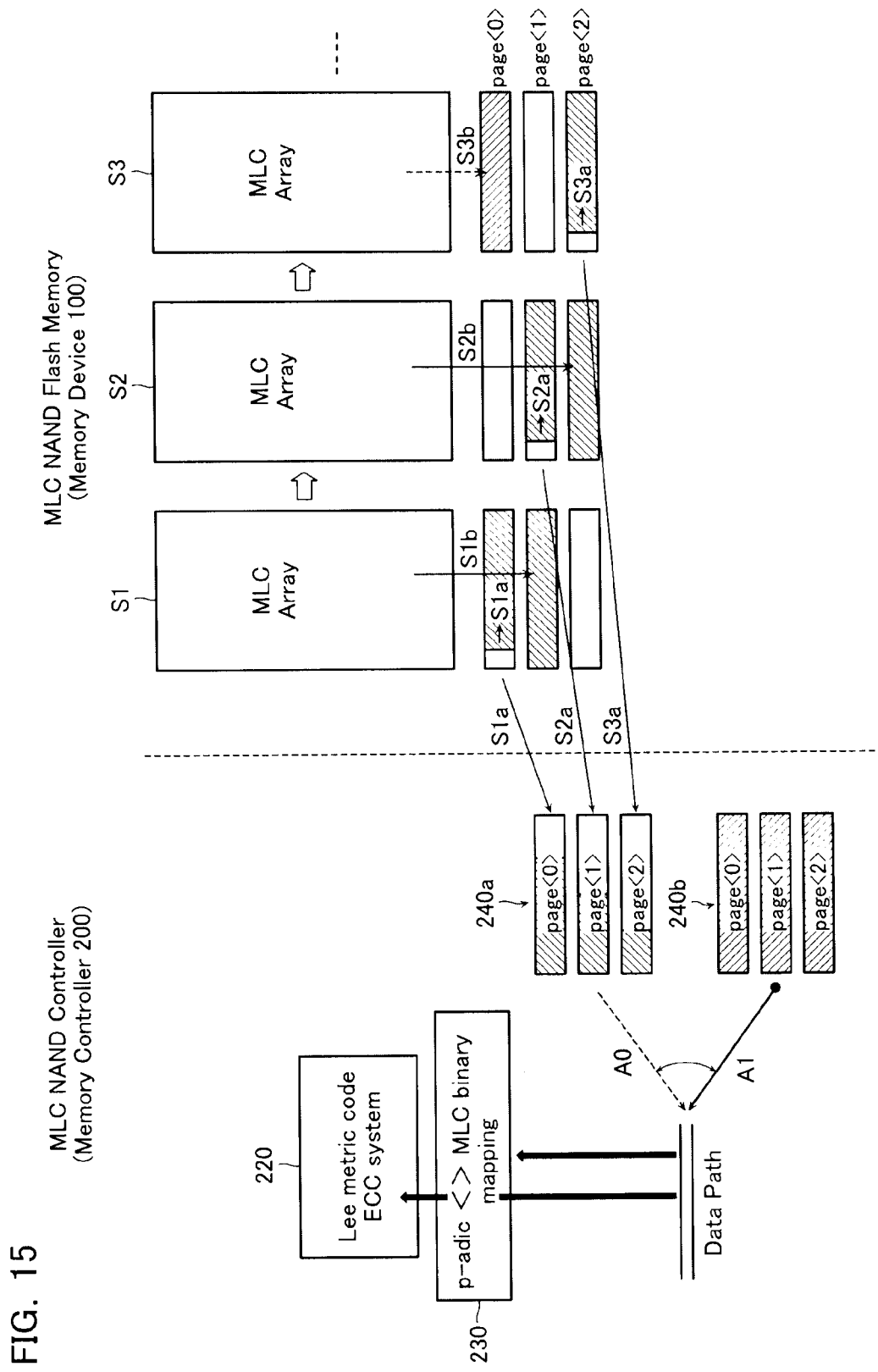
FIG. 15 is a diagram illustrative of data transfer between the memory device (8-level MLC NAND flash memory) and the memory controller at the time of data reading in the memory system according to the embodiment.

FIG. 15 is a diagram illustrative of data transfer between the page buffer group 240 in the memory controller 200 and the page buffer in the MLC NAND flash memory at the time of data read shown in FIG. 13.

FIG. 15 shows the state at the time of reading data from the i-th page group, in which the page buffer group 240b in the memory controller 200 has already stored data read out of the (i−1)-th page group. In addition, the page buffer group 240a keeps the data, which has been read out of the (i−2)-th page group. On the other hand, the page buffer, page<0>, in the MLC NAND flash memory has already stored data in L page in the i-th page group.

The data path in the memory controller 200 is connected to the page buffer group 240b (A1 in FIG. 15).

In this state, data transfer at the time of data read from the i-th page group is executed as follows.

First, at step S1, data in L page in the i-th page group already stored in the page buffer, page<0>, in the MLC NAND flash memory is transferred to the page buffer, page<0>, in the page buffer group 240a in the memory controller 200 (S1a in FIG. 15). Thus, data in the (i−2)-th page group kept in the page buffer group 240a is overwritten with data in the i-th page group. At the same time, in the MLC NAND flash memory, data in M page in the i-th page group read out of the MLC array is stored in the page buffer, page<1> (S1b in FIG. 15). In the memory controller 200, the data in the (i−1)-th page group stored in the page buffer group 240b is read out to external via the "p-adic MLC binary mapping" circuit block 230 and the "Lee metric code ECC system" circuit block 220. The reading of data out to external is executed in parallel also at and after the later-described step S2.

Subsequently, at step S2, after data in M page in the i-th page group is all stored in the page buffer, page<1>, in the MLC NAND flash memory, the data in M page in the i-th page group is transferred to the page buffer, page<1>, in the page buffer group 240a in the memory controller 200 (S2a in FIG. 15). At the same time, in the MLC NAND flash memory, the data in U page in the i-th page group read out of the MLC array is stored in the page buffer, page<2> (S2b in FIG. 15).

Subsequently, at step S3, after data in U page in the i-th page group is all stored in the page buffer, page<2>, in the MLC NAND flash memory, the data in U page in the i-th page group is transferred to the page buffer, page<2>, in the page buffer group 240a in the memory controller 200 (S3a in FIG. 15). At the same time, in the MLC NAND flash memory, the data in L page in the (i+1)-th page group read out of the MLC array is stored in the page buffer, page<0> (S3b in FIG. 15).

On the other hand, until step S3, in the memory controller 200, after the data in the (i−1)-th page group stored in the page buffer group 240b is all read out, the connection point of the page path is switched to the page buffer group 240a (A0 in FIG. 15).

Thereafter, while the connection point of the data path is switched alternately between the page buffer groups 240a (A1 in FIG. 15) and 240b (A2 in FIG. 15), steps S1-S3 are repeated so that transfer of data read out of plural page groups can be realized from the MLC NAND flash memory to the memory controller 200.

The following description is given to the case with the use of 16-level MLCs.

Figure 16:
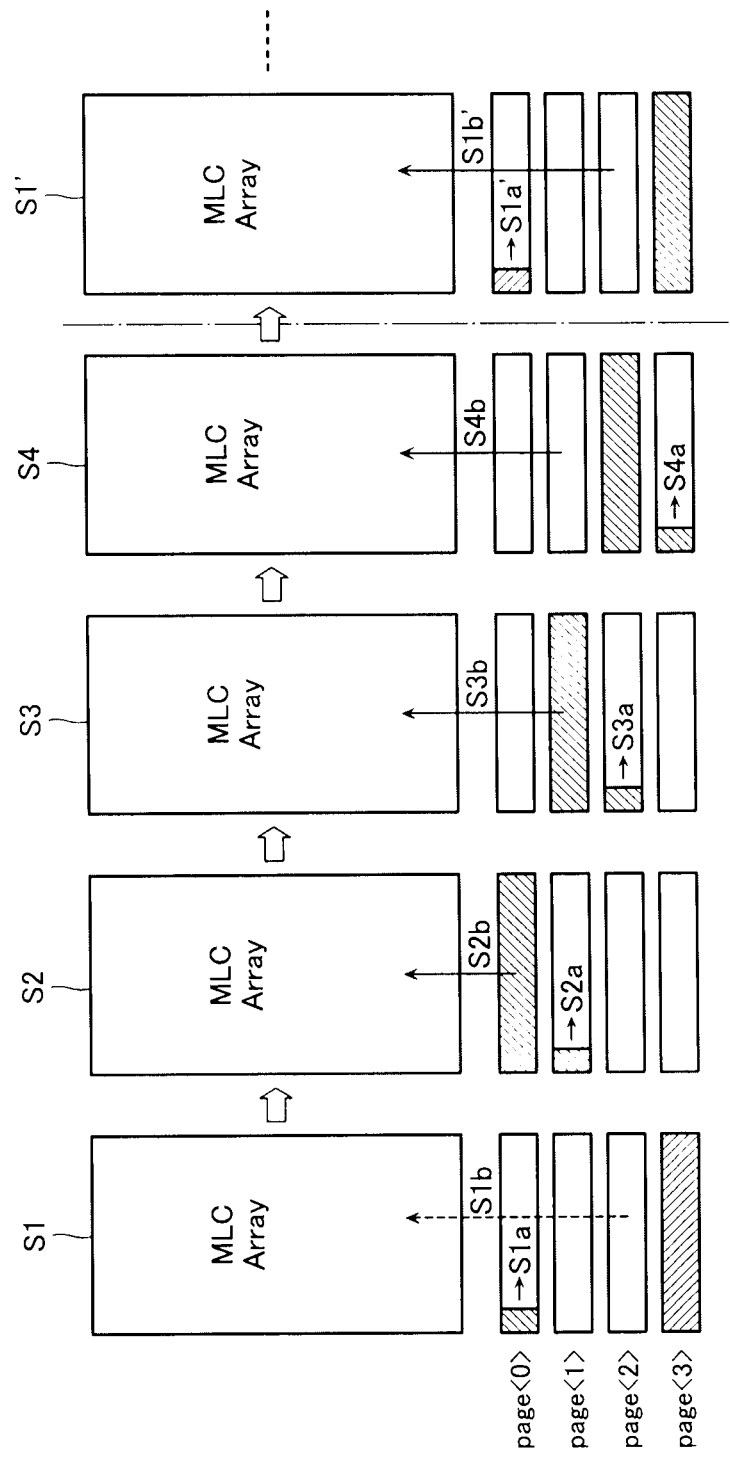
FIG. 16 is a diagram illustrative of operation of the page buffer at the time of data writing in a memory device (16-level MLC NAND flash memory) in the memory system according to the embodiment.

FIG. 16 is a diagram showing an example of operation of the page buffer at the time of data write in the MLC NAND flash memory including 16-level (4-bit) MLCs.

Hereinafter, of 4 bits of MLC, the lowermost weight bit is referred to as "L bit", the around middle weight bits as "M1 bit", "M2 bit", and the uppermost weight bit as "U bit". In addition, pages composed of certain numbers of L bits, M1 bits, M2 bits and U bits of MLC are referred to as "L page", "M1 page", "M2 page" and "U page", respectively. Further, L page, M1 page, M2 page and U page in common MLCs are collectively referred as a "page group".

The MLC NAND flash memory shown in FIG. 16 comprises 4 series of page buffers, page<0>-<3>. These page buffers, page<0>, <1>, <2>, <3>, are used at the time of data write or data read in L page, M1 page, M2 page, U page, respectively.

Data write to MLC can be realized by first shifting the threshold level of MLC roughly and then gradually shifting it finely until determined. Therefore, for example, data in L page may be associated with the roughest section of the MLC threshold levels, data in M1 page and M2 page with the around middle sections of the MLC threshold levels, and data in U page with the finest section of the MLC threshold levels. Then, data write in L page, data write in M1 page, data write in M2 page, and data write in U page are executed in turn to determine the MLC threshold level.

Data write in the i-th page group is executed at the following steps.

First, at step S1, data in L page in the i-th page group transferred from the memory controller 200 is stored in the page buffer, page<0> (S1a in FIG. 16). At the same time, data in U page in the (i−1)-th page group already stored in the page buffer, page<3>, is written in an MLC array (S1b in FIG. 16).

Subsequently, at step S2, data in M1 page in the i-th page group transferred from the memory controller 200 is stored in the page buffer, page<1> (S2a in FIG. 16). At the same time, the data in L page in the i-th page group stored in the page buffer, page<0>, at the previous step S1 is written in the MLC array (S2b in FIG. 16).

Subsequently, at step S3, data in M2 page in the i-th page group transferred from the memory controller 200 is stored in the page buffer, page<2> (S3a in FIG. 16). At the same time, the data in M1 page in the i-th page group stored in the page buffer, page<1>, at the previous step S2 is written in the MLC array (S3b in FIG. 16).

Subsequently, at step S4, data in U page in the i-th page group transferred from the memory controller 200 is stored in the page buffer, page<3> (S4a in FIG. 16). At the same time, the data in M2 page in the i-th page group stored in the page buffer, page<2>, at the previous step S2 is written in the MLC array (S4b in FIG. 16).

Subsequently, at step S1', the data in U page in the i-th page group stored in the page buffer, page<3>, at the previous step S4 is written in the MLC array (S1b' in FIG. 16). At the same time, data in L page in the (i+1)-th page group transferred from the memory controller 200 is stored in the page buffer, page<0> (S1a' in FIG. 16).

Hereinafter, steps S1-S4 are repeated to complete data write in plural page groups.

Figure 17:
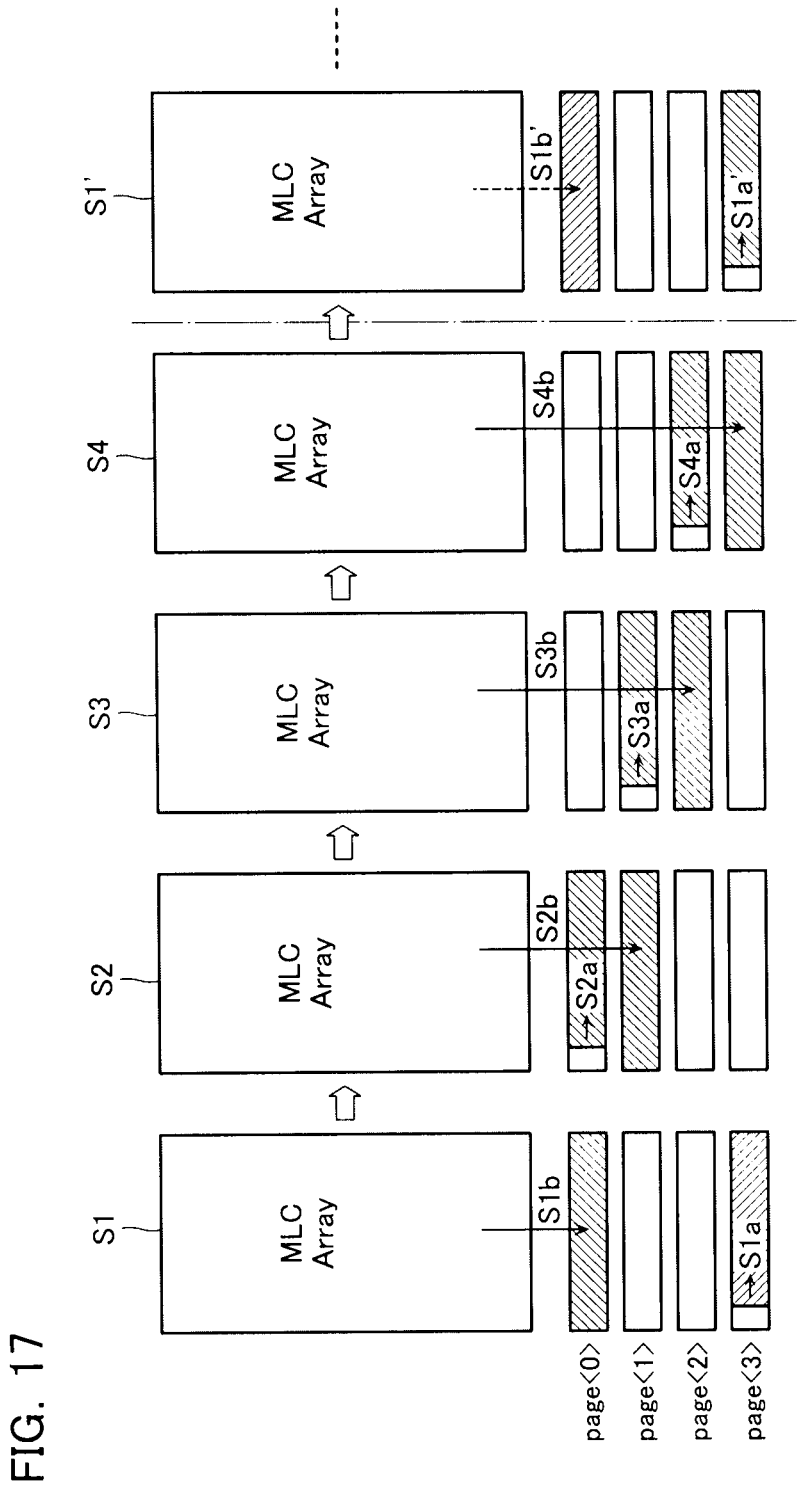
FIG. 17 is a diagram illustrative of operation of the page buffer at the time of data reading in the memory device (16-level MLC NAND flash memory) in the memory system according to the embodiment.

FIG. 17 is a diagram showing an example of operation of the page buffers at the time of data read in the MLC NAND flash memory comprising 16-level (4-bit) MLCs.

Data read in the i-th page group is executed at the following steps.

First, at step S1, data in L page in the i-th page group read out of the MLC array is stored in the page buffer, page<0> (S1b in FIG. 17). At the same time, the data in U page in the (i−1)-th page group already stored in the page buffer, page<3>, is transferred to the memory controller 200 (S1a in FIG. 17).

Subsequently, at step S2, the data in M1 page in the i-th page group read out of the MLC array is stored in the page buffer, page<1> (S2b in FIG. 17). At the same time, the data in L page in the i-th page group stored in the page buffer, page<0>, at the previous step S1 is transferred to the memory controller 200 (S2a in FIG. 17).

Subsequently, at step S3, the data in M2 page in the i-th page group read out of the MLC array is stored in the page buffer, page<2> (S3b in FIG. 17). At the same time, the data in M1 page in the i-th page group stored in the page buffer, page<1>, at the previous step S2 is transferred to the memory controller 200 (S3a in FIG. 17).

Subsequently, at step S4, the data in U page in the i-th page group read out of the MLC array is stored in the page buffer, page<3>. At the same time, the data in M2 page in the i-th page group stored in the page buffer, page<2>, at the previous step S3 is transferred to the memory controller 200 (S4a in FIG. 17).

Subsequently, at step S1', the data in U page in the i-th page group stored in the page buffer, page<3>, at the previous step S4 is transferred to the memory controller 200 (S1a' in FIG. 17). At the same time, the data in L page in the (i+1)-th page group read out of the MLC array is stored in the page buffer, page<0> (S1b' in FIG. 17).

Hereinafter, steps S1-S4 are repeated to complete data read in plural page groups.

As described above, the MLC NAND flash memory progresses storing data in the page buffers, page<0>-<3>, and writing data to the MLC array or reading data from the memory controller 200 at the same time in different pages.

The following description is given to data transfer between the page buffer group 240 in the memory controller 200 and the page buffer in the MLC NAND flash memory in the case of FIGS. 16 and 17.

Figure 18:
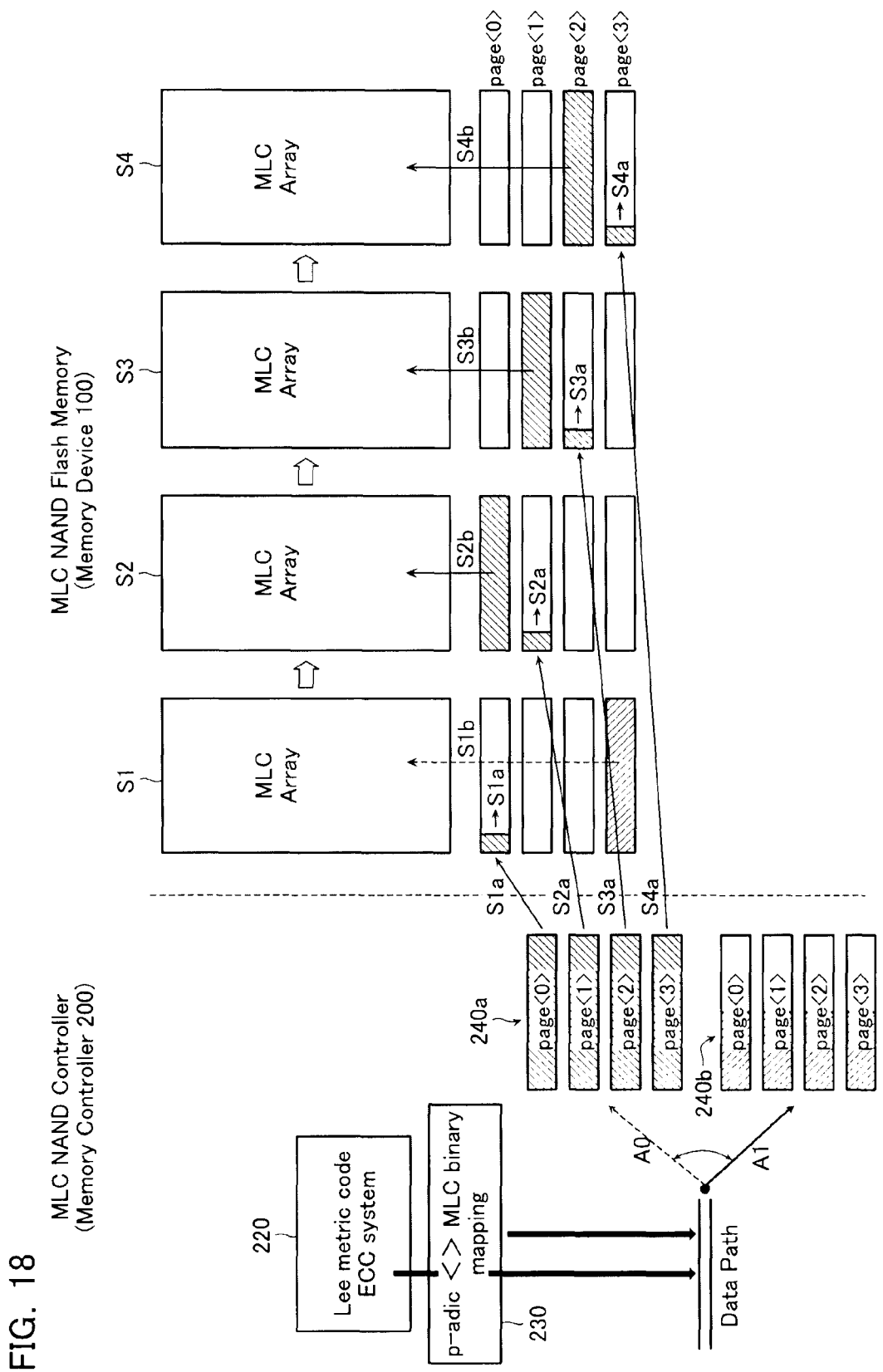
FIG. 18 is a diagram illustrative of data transfer between the memory device (16-level MLC NAND flash memory) and the memory controller at the time of data writing in the memory system according to the embodiment.

FIG. 18 is a diagram illustrative of data transfer between the page buffer group 240 in the memory controller 200 and the page buffer in the MLC NAND flash memory at the time of data write shown in FIG. 16.

FIG. 18 shows the state at the time of writing data to the i-th page group, in which the page buffer group 240a in the memory controller 200 has already stored data to be written in the i-th page group. In addition, the page buffer group 240b keeps the data, which has been written in the (i−1)-th page group. On the other hand, the page buffer, page<3>, in the MLC NAND flash memory has already stored data in U page in the (i−1)-th page group.

The memory controller 200 has a data path operative to selectively connect the "p-adic < > MLC binary mapping" circuit block 230 with the page buffer groups 240a and 240b. In the case of FIG. 18, the data path is connected to the page buffer group 240b (A1 in FIG. 18).

In this state, data transfer at the time of data write to the i-th page group is executed as follows.

First, at step S1, data in L page in the i-th page group transferred from the page buffer, page<0>, in the page buffer group 240a is stored in the page buffer, page<0>, in the MLC NAND flash memory (S1a in FIG. 18). At the same time, the data in U page in the (i−1)-th page group already stored in the page buffer, page<3>, in the MLC NAND flash memory is written in the MLC array (S1b in FIG. 18). In the memory controller 200, data to be written in the (i+1)-th page group is transferred via the "p-adic < > MLC binary mapping" circuit block 230 from the "Lee metric code ECC system" circuit block 220 to the page buffer group 240b. Thus, as shown in FIG. 8, the (i−1)-th data kept in the page buffer group 240b is overwritten with the (i+1)-th data. Data transfer to the page buffer group 240b is also executed in parallel at and after the later-described step S2.

Subsequently, at step S2, after data in L page in the i-th page group is all transferred from the page buffer, page<0>, in the page buffer group 240a to the page buffer, page<0>, in the MLC NAND flash memory, the data in L page in the i-th page group is written in the MLC array (S2b in FIG. 18). At the same time, the data in M1 page in the i-th page group transferred from the page buffer, page<1>, in the page buffer group 240a is stored in the page buffer, page<1>, in the MLC NAND flash memory (S2a in FIG. 18).

Subsequently, at step S3, after data in M1 page in the i-th page group is all transferred from the page buffer, page<1>, in the page buffer group 240a to the page buffer, page<1>, in the MLC NAND flash memory, the data in M1 page in the i-th page group is written in the MLC array (S3b in FIG. 18). At the same time, the data in M2 page in the i-th page group transferred from the page buffer, page<2>, in the page buffer group 240a is stored in the page buffer, page<2>, in the MLC NAND flash memory (S3a in FIG. 18).

Subsequently, at step S4, after data in M2 page in the i-th page group is all transferred from the page buffer, page<2>, in the page buffer group 240a to the page buffer, page<2>, in the MLC NAND flash memory, the data in M2 page in the i-th page group is written in the MLC array (S4b in FIG. 18). At the same time, the data in U page in the i-th page group transferred from the page buffer, page<3>, in the page buffer group 240a is stored in the page buffer, page<3>, in the MLC NAND flash memory (S4a in FIG. 18).

On the other hand, until step S4, the page buffer group 240b in the memory controller 200 has already stored data to be written in the (i+1)-th page group. Thus, immediately after completion of step S4, transfer of data in the (i+1)-th page group to the MLC NAND flash memory is started.

Thereafter, while the connection point of the data path is switched alternately between the page buffer groups 240a (A1 in FIG. 18) and 240b (A2 in FIG. 18), steps S1-S4 are repeated so that transfer of write data for plural page groups can be realized from the memory controller 200 to the MLC NAND flash memory.

Figure 19:
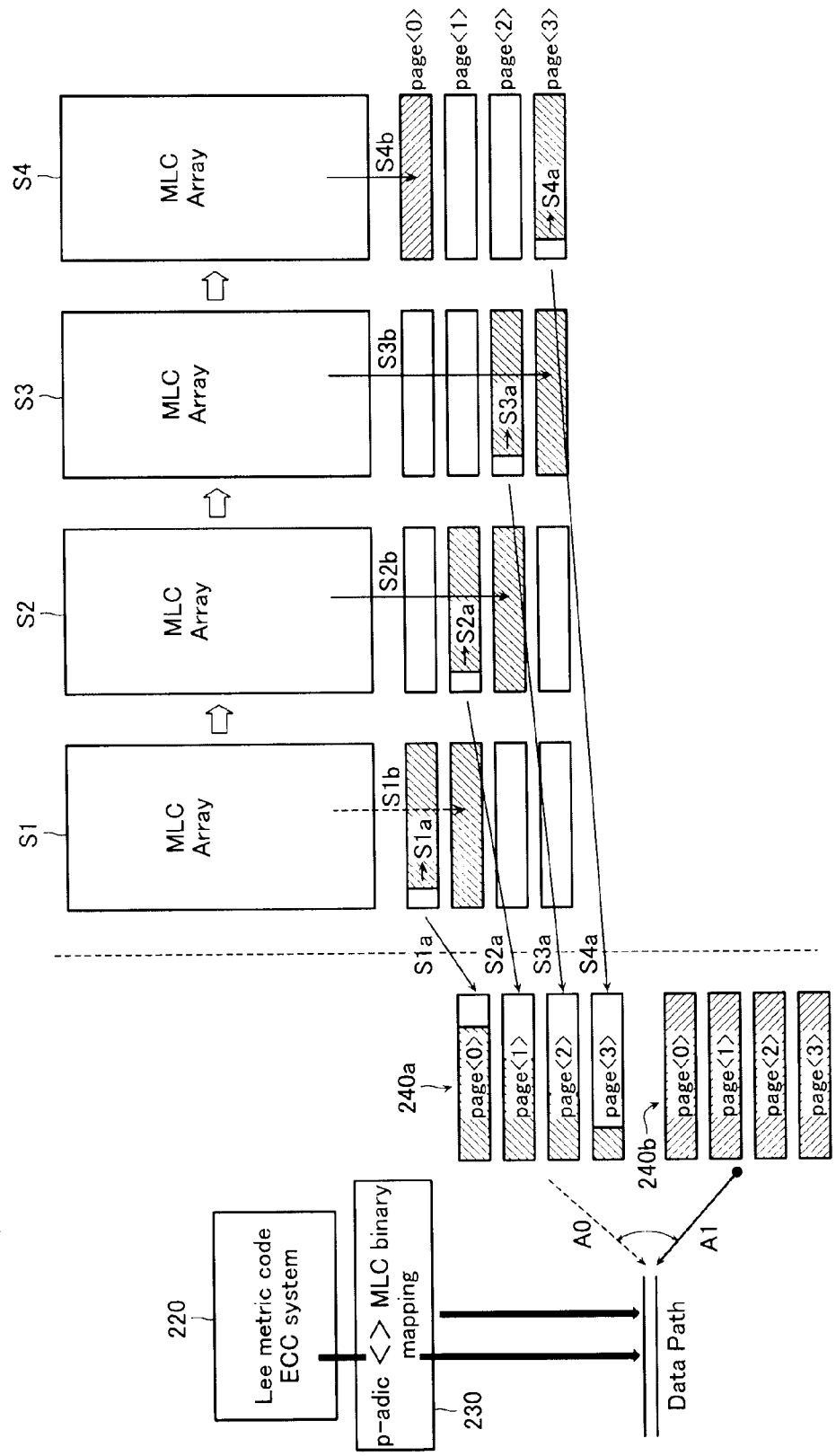
FIG. 19 is a diagram illustrative of data transfer between the memory device (16-level MLC NAND flash memory) and the memory controller at the time of data reading in the memory system according to the embodiment.

FIG. 19 is a diagram illustrative of data transfer between the page buffer group 240 in the memory controller 200 and the page buffer in the MLC NAND flash memory at the time of data read shown in FIG. 17.

FIG. 19 shows the state at the time of reading data from the i-th page group, in which the page buffer group 240b in the memory controller 200 has already stored data read out of the (i−1)-th page group. In addition, the page buffer group 240a keeps the data, which has been read out of the (i−2)-th page group. On the other hand, the page buffer, page<0>, in the MLC NAND flash memory has already stored data in L page in the i-th page group.

The data path in the memory controller 200 is connected to the page buffer group 240b (A1 in FIG. 19).

In this state, data transfer at the time of data read from the i-th page group is executed as follows.

First, at step S1, data in L page in the i-th page group already stored in the page buffer, page<0>, in the MLC NAND flash memory is transferred to the page buffer, page<0>, in the page buffer group 240a in the memory controller 200 (S1a in FIG. 19). Thus, data in the (i−2)-th page group kept in the page buffer group 240a is overwritten with data in the i-th page group. At the same time, in the MLC NAND flash memory, data in M1 page in the i-th page group read out of the MLC array is stored in the page buffer, page<1> (S1b in FIG. 19). In the memory controller 200, the data in the (i−1)-th page group stored in the page buffer group 240b is read out to external via the "p-adic MLC binary mapping" circuit block 230 and the "Lee metric code ECC system" circuit block 220. The reading of data out to external is executed in parallel also at and after the later-described step S2.

Subsequently, at step S2, after data in M1 page in the i-th page group is all stored in the page buffer, page<1>, in the MLC NAND flash memory, the data in M1 page in the i-th page group is transferred to the page buffer, page<1>, in the page buffer group 240a in the memory controller 200 (S2a in FIG. 19). At the same time, in the MLC NAND flash memory, the data in M2 page in the i-th page group read out of the MLC array is stored in the page buffer, page<2> (S2b in FIG. 19).

Subsequently, at step S3, after data in M2 page in the i-th page group is all stored in the page buffer, page<2>, in the MLC NAND flash memory, the data in M2 page in the i-th page group is transferred to the page buffer, page<2>, in the page buffer group 240A in the memory controller 200 (S3a in FIG. 19). At the same time, in the MLC NAND flash memory, the data in U page in the i-th page group read out of the MLC array is stored in the page buffer, page<3> (S3b in FIG. 19).

Subsequently, at step S4, after data in U page in the i-th page group is all stored in the page buffer, page<3>, in the MLC NAND flash memory, the data in U page in the i-th page group is transferred to the page buffer, page<3>, in the page buffer group 240a in the memory controller 200 (S4a in FIG. 19). At the same time, in the MLC NAND flash memory, the data in L page in the (i+1)-th page group read out of the MLC array is stored in the page buffer, page<0> (S4b in FIG. 19).

On the other hand, until step S4, in the memory controller 200, after the data in the (i−1)-th page group stored in the page buffer group 240b is all read out, the connection point of the page path is switched to the page buffer group 240a (A0 in FIG. 19).

Thereafter, while the connection point of the data path is switched alternately between the page buffer groups 240a (A1 in FIG. 19) and 240b (A2 in FIG. 19), steps S1-S4 are repeated so that transfer of data read out of plural page groups can be realized from the MLC NAND flash memory to the memory controller 200.

The above description is given to the methods of transferring data between the page buffer in the MLC NAND flash memory and the page buffer group 240 in the memory controller 200 in the cases with the use of 8-level MLCs and 16-level MLCs.

In the case of the p-adic controller such as the memory controller 200, on the other hand, mapping becomes important between the page buffer group 240 in the memory controller 200 and pages in the MLC NAND flash memory.

The mapping is sufficient if consistency can be found between the memory device 100 and the memory controller 200, and thus mapping of data between the memory system and the outside is arbitrary. If the mapping of data between the memory system and the outside can be set well, it is made possible to complicate the correspondence relation between data to be recorded in the memory device 100 and actual binary data so as to enhance the security for the recorded data. Hereinafter, the function block capable of arbitrary setting the mapping of data between the memory system and the outside is referred to as a "scrambler BSc".

When the memory controller 200 according to the present embodiment comprises the scrambler BSc, the numerals in Zp represented by symbols of Lee metric code and the MLC levels have the following correspondence relation, which is described with reference to FIG. 20.

Figure 20:
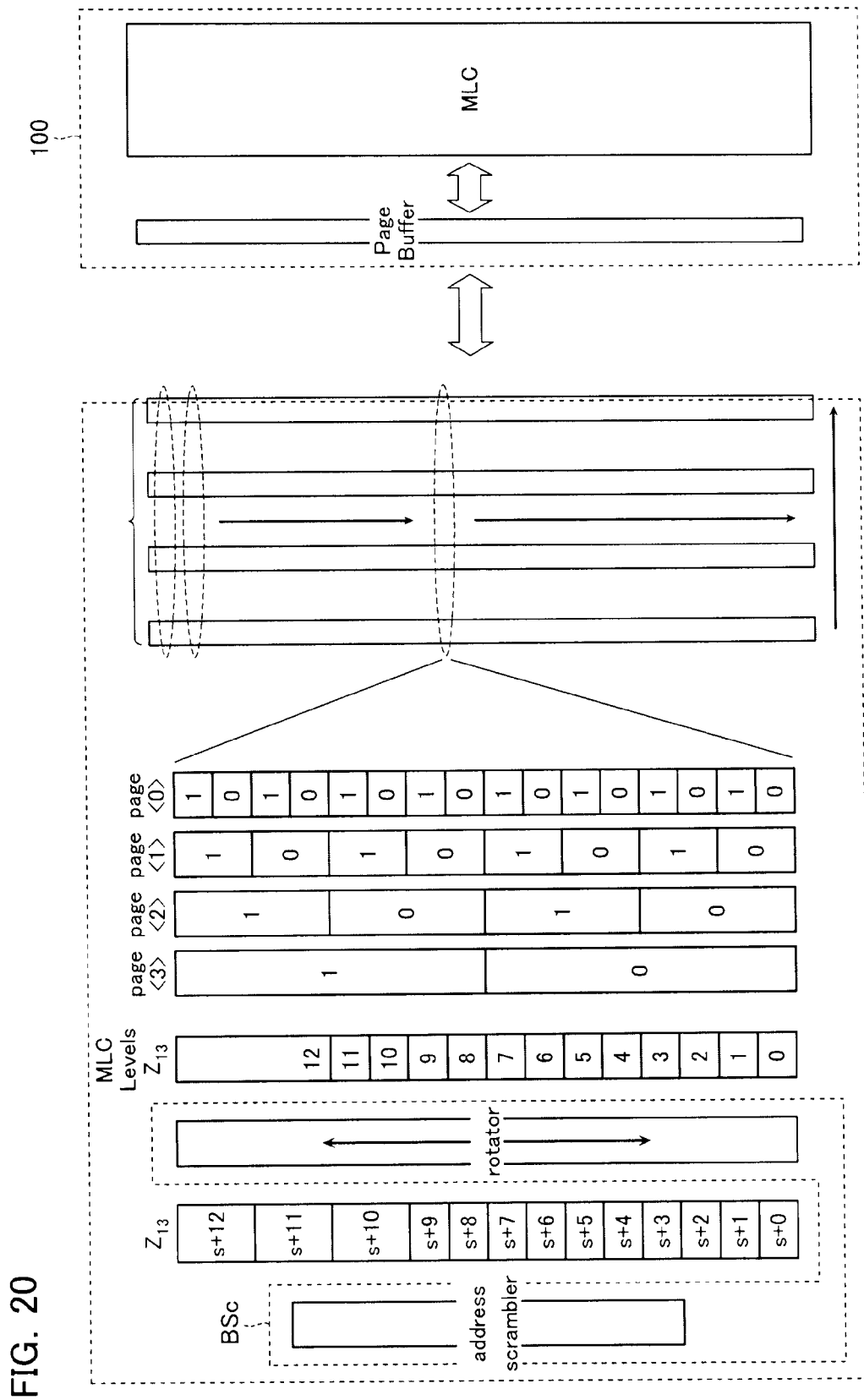
FIG. 20 is a diagram showing an example of the correspondence between numerals in a finite field Zp and MLC levels in the memory system according to the embodiment.

The scrambler BSc shown in FIG. 20 comprises an "address scrambler" circuit block and a "rotator" circuit block.

The "address scrambler" circuit block, after external input binary data is converted to a code having components corresponding to numerals in Zp, determines addresses within a page to store the components of the code therein.

Data transfer between the MLC NAND controller (memory controller 200) and the MLC NAND flash memory (memory device 100) is all executed in the form of the code having components corresponding to numerals in Zp. If the correspondence relation is constant between the numerals in Zp and the MLC levels at the time of data write and data read, the "address scrambler" circuit block can execute arbitrary setting of addresses within a page to store the components of the code therein at every memory controller 200.

On the other hand, the "rotator" circuit block maps the numerals in Zp represented by the components of the code to the MLC levels while keeping the cyclic sequence thereof.

Zp comprises numerals in the cyclic sequence, and variations in the numerals can be detected and corrected by ECC using Lee metric code. While keeping the cyclic sequence of Zp, it may be mapped to the MLC levels such that the error caused between adjacent levels can stay at the minimum variation in the numerals in Zp. Therefore, if the cyclic sequence of Zp and the sequence of MLC levels has no blank in the correspondence therebetween, and if the correspondence relation is constant at every MLC at the time of data write and data read, the correspondence relation between the numerals in Zp and the absolute levels of MLC has no restriction, and in the "rotator" circuit block, it is possible to execute arbitrarily setting at every memory controller 200.

The case of FIG. 20 is a diagram illustrative of the correspondence relation between the MLC levels and the numerals in Zp in the case of p=13.

First, n=p−1=12 components represented by the components of the code are mapped to addresses in a page of the MLC NAND flash memory at the "address scrambler" circuit block.

If the numbers 0-12 are assigned to the levels of MLC from the lowermost level to the uppermost level at ascending order or descending order, the "rotator" circuit block maps the MLC level numbers to 13 components in Zp. In the example of FIG. 20, the numerals in Zp are added with s (s is an integer) for conversion to the MLC level numbers.

The correspondence between the MLC levels and the bits of data in the page buffer may include the use of Gray code as shown in FIG. 20. This follows the specification of the memory device 100.

[Characteristic of Memory Controller According to Embodiment and Associated Discriminating Method]

In addition to the scrambler BSc capable of scrambling the code having components corresponding to the numerals in Zp shown in FIG. 20, the memory controller 200 may contain a scrambler capable of scrambling binary data itself (hereinafter, this function block is referred to as a "scrambler ASc").

The scrambler ASc brings data transferred between the memory controller 200 and a CPU and so forth via data/command buses into mapping to data processed inside the memory controller 200. For example, it executes processing such as sequencing in any way or inverting data serially input to the memory controller 200.

In a word, the memory controller 200 scrambles data at 2 positions by the scrambler ASc close to the CPU and the scrambler BSc close to the memory device 100. In accordance with the actions of these scramblers ASc and BSc, the correspondence relation between the data on the data/command buses and the data to be stored in the memory device 100 can be made extremely complicated and unpredictable.

Therefore, for discriminating if the memory controller 200 according to the embodiment is used or not, it is required to know the characteristic of the memory controller 200 independent of these scramblers ASc and BSc.

Then, the influence of these scramblers ASc and BSc is described next with reference to FIG. 21.

Hereinafter, the minimum set of data processed in batch at the memory controller, of the data on the data bus close to the CPU, is denoted with (D), and the minimum set of data after processing data D at the memory controller is denoted with (δ). The action of data processing is represented with *. Data processing in the p-adic controller (the memory controller 200 according to the embodiment) body except the scramblers ASc and BSc is denoted with P, and data processing in the binary linear controller body (the memory controller according to the comparison example) except the scramblers ASc and BSc is denoted with L. In accordance with this representing method, when the scrambler ASc acts on the data D, for example, the result can be represented as ASc(D). Further, when the p-adic controller acts on ASc (D), the result can be represented as P*ASc(D).

The characteristics of the memory controllers, that is, the p-adic controller and the binary linear controller, appear on entering arbitrary data [c] and the inverted data [/c] as data (D).

First, the characteristic of the p-adic controller is described.

When data (D) is processed in the p-adic controller, data (δ) becomes as in Expression 11.

$$BSc*P*ASc(D)=(\delta) \quad \text{[Expression 11]}$$

On entering [c], [/c] as data (D), the result from the action of the scrambler ASc can be represented as in Expression 12.

$$ASc[c]=(a)$$

$$ASc[/c]=(/a) \quad \text{[Expression 12]}$$

As the scrambler ASc is operable to scramble any data (D) at constant manner, the results from the action of the scrambler ASc on data [c] and [/c] are complementarily related as well.

Further, the results, P(a) and P(/a), from the action of data processing in the p-adic controller body on data (a) and data (/a) in Expression 12 can be represented as in Expression 13.

$$P(a)=(\alpha)$$

$$P(/a)=(\beta) \quad \text{[Expression 13]}$$

As data processing in the p-adic controller body, such as the conversion from binary data to p-adic data, can establish no linear relation, data (α) and data (β) cannot be related simply.

The results, BSc (α), BSc(β), from the additional action of the scrambler BSc on the data (α), (β) can be represented as in Expression 14.

$$BSc(\alpha)=BSc*P*ASc[c]=(X)$$

$$BSc(\beta)=BSc*P*ASc[/c]=(Y) \quad \text{[Expression 14]}$$

As the scrambler BSc is operable to scramble any data (D) at constant manner, the resultant (X) and (Y) obtained from the action of the scrambler BSc on complicatedly related data (α) and (β) are complicatedly related as well.

In a word, when the p-adic controller processes data, the data input to the p-adic controller is nonlinearly related to the data output after added with parity information at the p-adic controller.

Subsequently, the characteristic of the binary linear controller according to the comparison example is described.

When data (D) is processed in the binary linear controller, data (δ) becomes as in Expression 15.

$$BSc*L*ASc(D)=(\delta) \quad \text{[Expression 15]}$$

On entering [c], [/c] as data (D), the result from the action of the scrambler ASc can be represented as in Expression 16.

$$ASc[c]=(a)$$

$$ASc[/c]=(/a) \quad \text{[Expression 16]}$$

Further, the results, L(a) and L(/a), from data processing in the binary linear controller body on data (a) and data (/a) in Expression 16 can be represented as in Expression 17.

$$L(a)=(\alpha)$$

$$L(/a)=(\beta) \quad \text{[Expression 17]}$$

The bit-by-bit sum mod (2) result of data ($\alpha$) and ($\beta$) resulted from processing 2 pieces of complimentary data (a) and (/a) at the binary linear controller body establishes such the relation as in Expression 18.

$$(\alpha)+(\beta)=L\{(a)+(/a)\}=L[1]=[1]' \quad \text{[Expression 18]}$$

Here, [1]' indicates that the bit-by-bit sum mod (2) result of data ($\alpha$) and ($\beta$) includes the part corresponding to data (D), which exhibits all '1'. As for parity data, even if pieces of data [c] and [/c] are complementarily related to each other, pieces of parity data are not complementarily related to each other. Therefore, the sum mod (2) result thereof cannot always become '1'.

Therefore, with respect to BSc ($\alpha$), BSc($\beta$) resulted from the action of the scrambler BSc on data ($\alpha$), ($\beta$), such the relations as in Expression 19 can establish.

$$BSc(\alpha)=BSc*L*ASc[c]=(X)$$

$$BSc(\beta)=BSc*L*ASc[/c]=(Y)$$

$$(X)+(Y)=[1]' \quad \text{[Expression 19]}$$

As described above, the characteristics of the p-adic controller and the binary linear controller become obvious by comparing the complementary data with the processed data. The characteristics can be used to discriminate the types of memory controllers from external.

Figure 21:
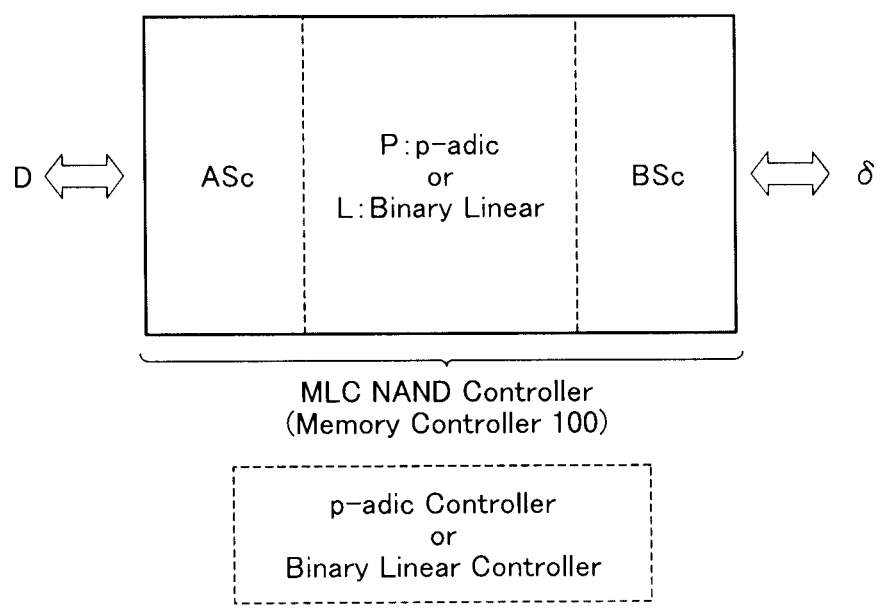
FIG. 21 is a diagram illustrative of a method of discriminating memory controllers according to the embodiment.

In FIG. 21, the scramblers ASc and BSc are contained in the memory controller though they may be located outside the memory controller.

The following description is given to procedures of discriminating memory controllers between the p-adic controller and the binary linear controller.

Figure 22:
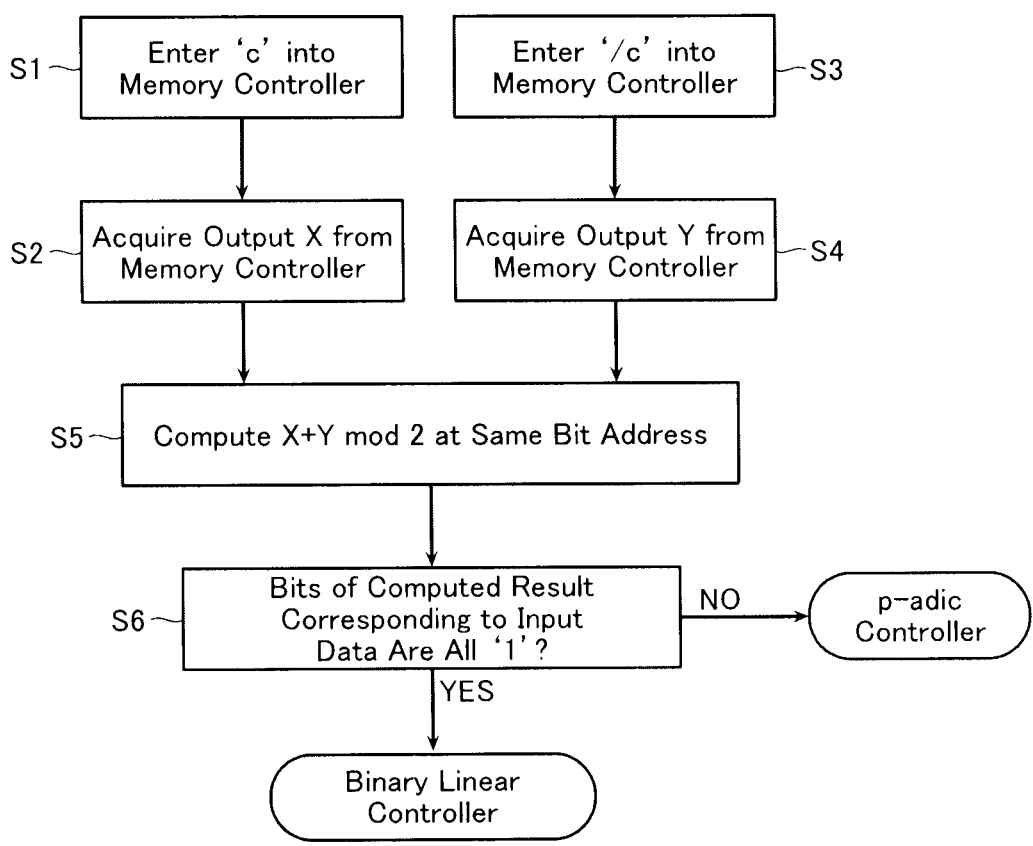
FIG. 22 is a diagram illustrative of a procedure of discriminating memory controllers according to the embodiment.

FIG. 22 is a diagram illustrative of a procedure of discriminating memory controllers.

First, data c is entered into the memory controller (step S1 in FIG. 22), and then data X output from the memory controller to the memory device is acquired (step S2 in FIG. 22). Similarly, inverted data /c of the data c is entered into the memory controller (step S3 in FIG. 22), and then data Y output from the memory controller to the memory device is acquired (step S4 in FIG. 22).

Subsequently, the bit-by-bit modulo 2 sum of data X and Y is computed (step S5 in FIG. 22).

Then, specific bits in the sum result corresponding to input data are verified if they are all '1' (step S6 in FIG. 22). The specific bits are the same in the number of bits as the input data. If the specific bits in the sum result are all '1', the memory controller can be discriminated as the binary linear controller. If not, in a word, if the specific bits in the sum result include '0', the memory controller can be discriminated as the p-adic controller. In a word, the use of the p-adic controller (the memory controller 200) according to the present embodiment may not allow '1's equal to or more than the number of bits of the input data to exist in the sum result obtained at step S5.

Figure 23:
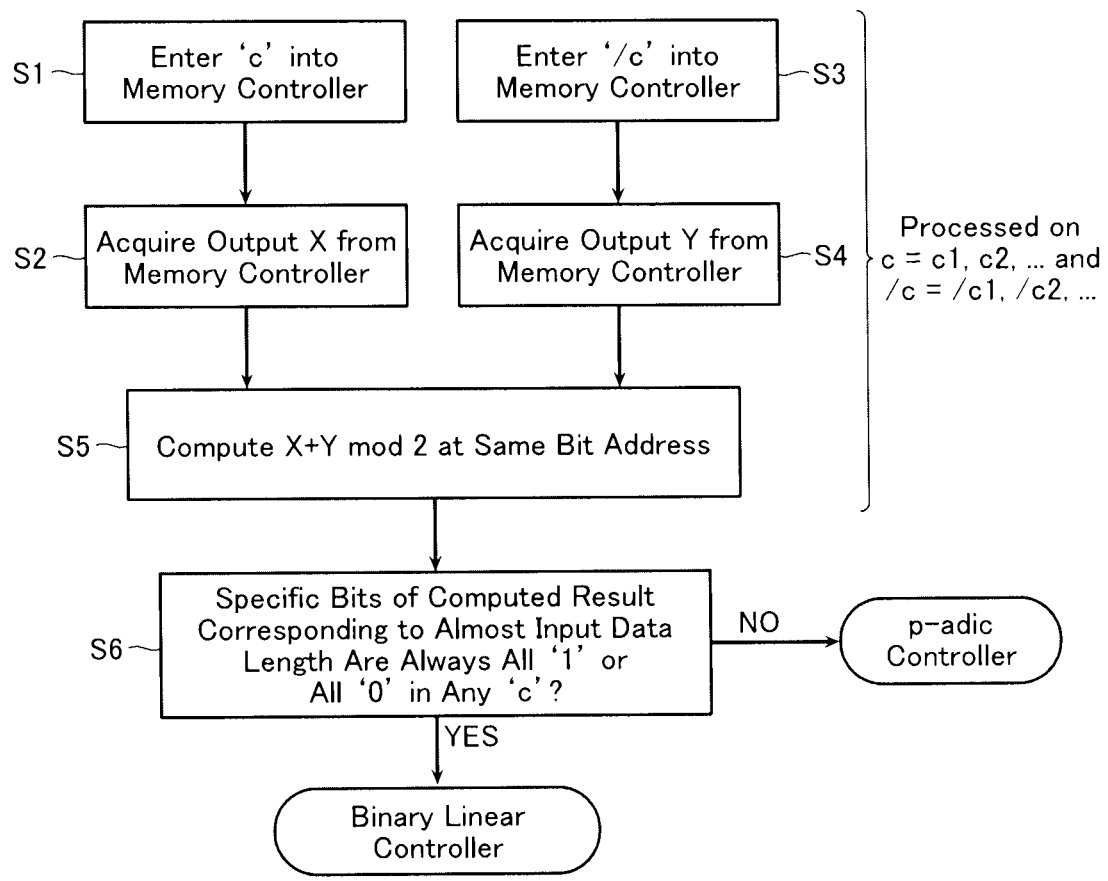
FIG. 23 is a diagram illustrative of a procedure of discriminating memory controllers according to the embodiment.

FIG. 23 is a diagram illustrative of another procedure of discriminating memory controllers.

There are some methods of encoding data to Reed-Solomon code and, depending on the method, bits of the resultant Reed-Solomon code may not be divided clearly into information part corresponding to the data and other parity part.

Even in such the case, however, if the binary linear controller is used, the bit-by-bit modulo 2 sum of the output data X at the time of entering the data c and the output data Y at the time of entering the complementary data /c of the data c yields the sum result, of which specific bits having almost the same number of bits as the input data exhibit all '1' or all '0'. This characteristic appears independent of input data. If the p-adic controller is used, on the other hand, such the characteristic cannot appear.

In a word, the use of the characteristic of the binary linear controller makes it possible to discriminate the types of memory controllers even with the use of the code containing clearly undividable information and parity parts.

In the case of FIG. 23, plural pieces of data $c=c_1, c_2, \ldots$ and the inverted data $/c=/c_1, /c_2, \ldots$ are used as input data to execute the procedure similar to steps S1-S5. Thus, the sum result modulo 2 of the output data X and Y can be obtained at every pair of the data c and the inverted data /c.

If specific bits, of each sum result, having almost the same number of bits as the input data are all '1' or all '0' and if the positions of the specific bits are common in all the sum results, the memory controller can be discriminated as the binary linear controller. If not, the memory controller can be discriminated as the p-adic controller (step S6 in FIG. 23).

The description at step S6 includes "almost the same number of bits as the input data", which means the number of bits equal to ⅔ the number of bits of the output data, for example. In other words, if specific bits of the sum result, equal to or more than ⅓, in number, the output data length, exhibit both '0' and '1', it is the p-adic controller.

The basis for "⅔" is derived from the fact that ECC is considered extremely poor in efficiency and not practical if it uses a code with parity information added to input data, of which size exceeds 50% of the size of the input data.

CONCLUSION

Thus, in the case of the systems such as the electronic instruments using the memory system and memory controller according to the present embodiment, it is possible to discriminate the types of memory controllers easily. In addition, the relation between the data input from external or data output to external and the data recorded in the memory device is more complicated than that in the case of the use of the binary linear controller so that the security can be made higher.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system that identifies a type of memory controller, comprising:

a memory device including a plurality of memory cells operative to store storage data, said storage data containing input data from external to which parity information is added; and a memory controller operative to convert between said input data and output data that is to be said storage data, wherein when two of said input data that are complementarily related are defined as an input data pair, and an exclusive-or of two of said output data that are generated by inputting to said memory controller said two of input data configuring said input data pair is defined as a computed result, said computed result including at least 1 bit of '0' data, and when a plurality of said computed results generated from a differing plurality of said input data pairs are compared on a bit by bit basis, the number of bits in which both '0' data and '1' data appear being greater than one third of a length of said output data, and the memory system determining said type of memory controller based on said computed result and said comparison of said plurality of said computed results.

2. The memory system according to claim 1, wherein said memory controller includes a p-adic converter unit operative to convert between binary data and p-adic data (p is a prime), and uses said p-adic converter unit to convert between said input data and said output data.

3. The memory system according to claim 1, wherein said memory device stores d bits (d is an integer of 2 or more) in every memory cell, and reads/writes data at every page composed of specific bits in a certain number of memory cells, and said memory controller includes a buffer register of the size d-times the size of said page, and communicates said output data with said memory device via said buffer register.

4. The memory system according to claim 3, wherein said memory controller includes plural such buffer registers.

5. The memory system according to claim 1, wherein said memory controller includes a scrambler operative to scramble at least one data of said input data and said output data, and converts between said input data and said output data via said scrambler.

6. A memory system that identifies a type of memory controller, comprising:

a memory device including a plurality of memory cells operative to store storage data, said storage data containing input data from external to which parity information is added; and a memory controller operative to convert between said input data and output data that is to be said storage data, said output data containing information data corresponding to said input data, said information data having the same number of bits as said input data, wherein when two of said input data that are complementarily related are defined as an input data pair, and an exclusive-or of two of said output data that are generated by inputting to said memory controller said two of input data configuring said input data pair is defined as a computed result, said computed result including at least 1 bit of '0' data, and when a plurality of said computed results generated from a differing plurality of said input data pairs are compared on a bit by bit basis, the number of bits in which both '0' data and '1' data appear being greater than one third of a length of said output data, and the memory system determining said type of memory controller based on said computed result and said comparison of said plurality of said computed results.

7. The memory system according to claim 6, wherein said memory controller includes a p-adic converter unit operative to convert between binary data and p-adic data (p is a prime), and uses said p-adic converter unit to convert between said input data and said output data.

8. The memory system according to claim 6, wherein said memory device stores d bits (d is an integer of 2 or more) in every memory cell, and reads/writes data at every page composed of specific bits in a certain number of memory cells, and said memory controller includes a buffer register of the size d-times the size of said page, and communicates said output data with said memory device via said buffer register.

9. The memory system according to claim 8, wherein said memory controller includes a plurality of such buffer registers.

10. The memory system according to claim 6, wherein said memory controller includes a scrambler operative to scramble at least one data of said input data and said output data, and converts between said input data and said output data via said scrambler.

11. A memory controller capable of controlling a memory device that identifies a type of memory controller and includes plural memory cells operative to store storage data, wherein said memory controller, when controlling said memory device, converts between input data from external and output data that is to be said storage data, said storage data containing said input data to which parity information is added, when two of said input data that are complementarily related are defined as an input data pair, and an exclusive-or of two of said output data that are generated by inputting to said memory controller said two of input data configuring said input data pair is defined as a computed result, said computed result including at least 1 bit of '0' data, and when a plurality of said computed results generated from a differing plurality of said input data pairs are compared on a bit by bit basis, the number of bits in which both '0' data and '1' data appear being greater than one third of a length of said output data, and said type of memory controller being determined based on said computed result and said comparison of said plurality of said computed results.

12. The memory controller according to claim 11, wherein said memory controller includes a p-adic converter unit operative to convert between binary data and p-adic data (p is a prime), and uses said p-adic converter unit to convert between said input data and said output data.

13. The memory controller according to claim 11, wherein said memory device stores d bits (d is an integer of 2 or more) in every memory cell, and reads/writes data at every page composed of specific bits in a certain number of memory cells, and said memory controller includes a buffer register of the size d-times the size of said page, and communicates said storage data with said memory device via said buffer register.

14. The memory controller according to claim 13, wherein said memory controller includes a plurality of such buffer registers.

15. The memory controller according to claim 11, wherein said memory controller includes a scrambler operative to scramble at least one data of said input data and said output data, and converts between said input data and said output data via said scrambler.

16. A method of operating a memory system that identifies a type of memory controller, comprising:
storing data in a memory device including a plurality of memory cells, said storage data containing input data from external to which parity information is added;
converting, using a memory controller, between said input data and output data that is to be said storage data, wherein
when two of said input data that are complementarily related are defined as an input data pair, and an exclusive-or of two of said output data that are generated by inputting to said memory controller said two of input data configuring said input data pair is defined as a computed result, said computed result including at least 1 bit of '0' data, and
when a plurality of said computed results generated from a differing plurality of said input data pairs are compared on a bit by bit basis, the number of bits in which both '0' data and '1' data appear being greater than one third of a length of said output data; and
determining said type of memory controller based on said computed result and said comparison of said plurality of said computed results.

17. The method according to claim 16, wherein
said memory controller includes a p-adic converter unit operative to convert between binary data and p-adic data (p is a prime), and uses said p-adic converter unit to convert between said input data and said output data.

18. The memory system according to claim 16, wherein
said memory device stores d bits (d is an integer of 2 or more) in every memory cell, and reads/writes data at every page composed of specific bits in a certain number of memory cells, and
said memory controller includes a buffer register of the size d-times the size of said page, and communicates said output data with said memory device via said buffer register.

19. The memory system according to claim 18, wherein
said memory controller includes plural such buffer registers.

20. The memory system according to claim 16, wherein
said memory controller includes a scrambler operative to scramble at least one data of said input data and said output data, and converts between said input data and said output data via said scrambler.

21. The memory system according to claim 16, wherein
said output data contains information data corresponding to said input data, said information data has the same number of bits as said input data.

* * * * *